(12) United States Patent
Hsieh et al.

(10) Patent No.: US 11,854,878 B2
(45) Date of Patent: Dec. 26, 2023

(54) BI-LAYER ALLOY LINER FOR INTERCONNECT METALLIZATION AND METHODS OF FORMING THE SAME

(71) Applicant: Taiwan Semiconductor Manufacturing Co., Ltd., Hsinchu (TW)

(72) Inventors: Huei-Wen Hsieh, Hsinchu (TW); Kai-Shiang Kuo, Hsinchu (TW); Cheng-Hui Weng, Hsinchu (TW); Chun-Sheng Chen, Hsinchu (TW); Wen-Hsuan Chen, Hsinchu (TW)

(73) Assignee: TAIWAN SEMICONDUCTOR MANUFACTURING LTD., Hsinchu (TW)

( * ) Notice: Subject to any disclaimer, the term of this patent is extended or adjusted under 35 U.S.C. 154(b) by 0 days.

(21) Appl. No.: 17/066,706

(22) Filed: Oct. 9, 2020

(65) Prior Publication Data
US 2021/0202310 A1    Jul. 1, 2021

Related U.S. Application Data

(60) Provisional application No. 62/954,240, filed on Dec. 27, 2019.

(51) Int. Cl.
*H01L 25/065* (2023.01)
*H01L 25/00* (2006.01)
(Continued)

(52) U.S. Cl.
CPC .... *H01L 21/76882* (2013.01); *H01L 21/7684* (2013.01); *H01L 21/76846* (2013.01);
(Continued)

(58) Field of Classification Search
CPC .......... H01L 21/76882; H01L 21/7684; H01L 21/76846; H01L 21/76862; H01L 23/5226;
(Continued)

(56) References Cited

U.S. PATENT DOCUMENTS 5,802,955 A * 9/1998 Stoll .................... C22C 29/005
977/700
6,153,935 A * 11/2000 Edelstein .......... H01L 21/76834
257/E21.174
(Continued)

FOREIGN PATENT DOCUMENTS

KR      20160045550 A    4/2016

OTHER PUBLICATIONS

DeProspo ("Fundamental Interdiffusion Analysis of Ruthenium and Cobalt Films" (2016). Nanoscale Science & Engineering, available at https://scholarsarchive.library.albany.edu/honorscollege_nano/10.) (Year: 2016).*

*Primary Examiner* — Marcos D. Pizarro
*Assistant Examiner* — Tenley H Schofield
(74) *Attorney, Agent, or Firm* — Slater Matsil, LLP

(57) ABSTRACT

A method of forming a semiconductor device includes forming an opening in a dielectric layer, and forming a barrier layer in the opening. A combined liner layer is formed over the barrier layer by first forming a first liner layer over the barrier layer, and forming a second liner layer over the first liner layer, such that the first liner layer and the second liner layer intermix. A conductive material layer is formed over the combined liner layer, and a thermal process is performed to reflow the conductive material layer.

20 Claims, 18 Drawing Sheets

(51) Int. Cl.
  *H01L 21/768*  (2006.01)
  *H01L 23/00*  (2006.01)
  *H01L 23/532*  (2006.01)
  *H01L 23/31*  (2006.01)
  *H01L 23/528*  (2006.01)
  *H01L 23/522*  (2006.01)
  *H01L 27/088*  (2006.01)

(52) U.S. Cl.
  CPC .... *H01L 21/76862* (2013.01); *H01L 23/5226* (2013.01); *H01L 23/5283* (2013.01); *H01L 23/53238* (2013.01); *H01L 27/0886* (2013.01)

(58) Field of Classification Search
  CPC ........... H01L 23/5283; H01L 23/53238; H01L 27/0886
  See application file for complete search history.

(56) References Cited

U.S. PATENT DOCUMENTS

| | | | | |
|---|---|---|---|---|
| 9,177,858 | B1* | 11/2015 | Zhang | H01L 21/76834 |
| 2004/0065540 | A1* | 4/2004 | Mayer | H01L 21/32134 |
| | | | | 257/E21.309 |
| 2005/0227479 | A1* | 10/2005 | Feng | H01L 21/76877 |
| | | | | 257/E21.585 |
| 2007/0059502 | A1* | 3/2007 | Wang | H01L 21/76873 |
| | | | | 428/209 |
| 2007/0072415 | A1* | 3/2007 | Suzuki | H01L 21/76864 |
| | | | | 438/681 |
| 2012/0141667 | A1 | 6/2012 | Kim et al. | |
| 2014/0008800 | A1* | 1/2014 | Chen | H01L 23/481 |
| | | | | 438/653 |
| 2015/0203961 | A1* | 7/2015 | Ha | C23C 16/45523 |
| | | | | 427/124 |
| 2015/0228585 | A1* | 8/2015 | He | H01L 21/76843 |
| | | | | 438/643 |
| 2016/0111325 | A1 | 4/2016 | JangJian et al. | |
| 2016/0273117 | A1* | 9/2016 | Doubina | H01L 21/76862 |
| 2018/0053725 | A1* | 2/2018 | Edelstein | H01L 21/3212 |
| 2018/0151424 | A1* | 5/2018 | Yao | H01L 21/76856 |
| 2018/0174915 | A1* | 6/2018 | Tsai | H01L 27/088 |
| 2018/0211872 | A1 | 7/2018 | Wu et al. | |
| 2019/0013240 | A1* | 1/2019 | LiCausi | H01L 23/53228 |
| 2020/0083435 | A1* | 3/2020 | Maniscalco | H10B 61/00 |

* cited by examiner

BI-LAYER ALLOY LINER FOR INTERCONNECT METALLIZATION AND METHODS OF FORMING THE SAME

PRIORITY CLAIM AND CROSS-REFERENCE

This application claims the benefit of U.S. Provisional Application No. 62/954,240, filed on Dec. 27, 2019, which application is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
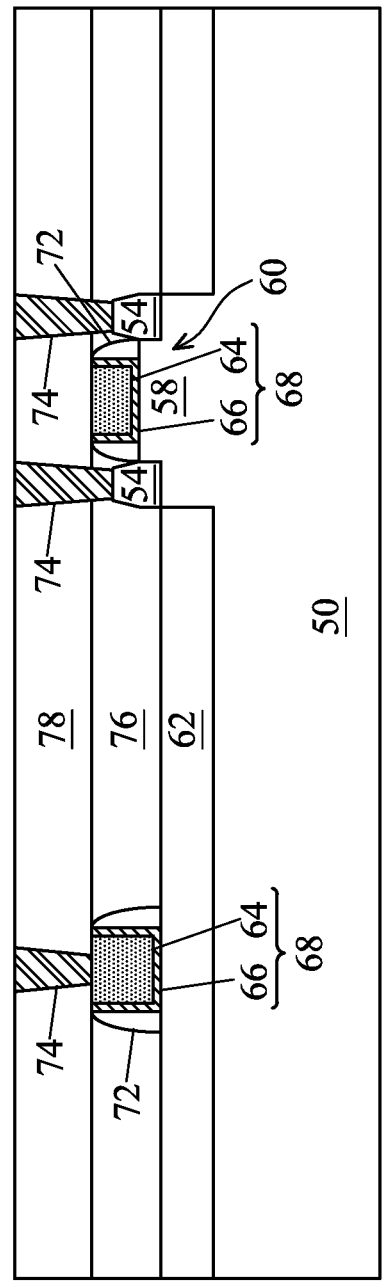
FIGS. 1, 2, 3, 4, 5, 6, 7, 8, 9, 10, 11, 12, 13, 14, 15, 16, 17, and 18 illustrate cross-sectional views of intermediate stages in the formation of interconnect structures of integrated circuits, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conductive features, such as conductive lines and metallization layers in an interconnect structure, and methods of forming the same are provided, according to some embodiments. In particular, the conductive features are formed having a barrier layer, multiple liner layers (forming a combined liner layer), and a conductive material to fill the conductive features. The combined liner layer has a strong adherence to the barrier layer while also improving the ability of the conductive material (e.g., during and after deposition) to flow over the combined liner layer in order to fill lower portions of openings and avoid pinch-offs in upper portions of the openings. In addition, at least one of the multiple liner layers may include a material similar to a material in a capping layer subsequently formed over the conductive material and the combined liner layer. Presence of that material in the combined liner layer reduces electromigration of that similar material from the capping layer to the combined liner layer during use of the completed semiconductor device. To achieve these and other benefits, the multiple liner layers are also selected for their ability to intermix with one another to form one continuous layer (e.g., the combined liner layer) while benefiting from certain properties of each of the multiple liner layers, such as interactions with nearby and neighboring layers. As a result of stronger adherence between the combined liner layer and the barrier layer, improved flowability of the conductive material over the combined liner layer, and reduction of electromigration of material from the capping layer into the combined liner layer, the resulting conductive features may be formed at greater yield and will perform with greater reliability.

FIGS. 1 through 18 illustrate cross-sectional views of intermediate stages in the formation of conductive features and interconnect structures of integrated circuits, in accordance with some embodiments. FIGS. 1 through 13 may illustrate formation of conductive lines of an interconnect structure using a single damascene process. FIGS. 14 through 18 may illustrate formation of a metallization layer (including metallization lines and conductive vias) of an interconnect structure using a dual damascene process.

FIG. 1 illustrates a cross-sectional view of a semiconductor structure on a wafer 100 comprising a substrate 50 (e.g., a semiconductor substrate) in which various electronic devices may be formed over the substrate 50, in accordance with some embodiments. In subsequent figures, a multilevel interconnect system may be formed over the various electronic devices and the substrate 50. Generally, as will be discussed in greater detail below, FIG. 1 illustrates a Fin field effect transistor (FinFET) device 60 formed on a substrate 50, with multiple interconnection layers formed thereover in later figures. Planar transistors, gate-all-around (GAA) transistors, and other types of devices are within the contemplated scope of this disclosure, however.

Generally, the substrate 50 illustrated in FIG. 1 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, MN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

The FinFET device 60 illustrated in FIG. 1 is a three-dimensional metal-oxide-semiconductor field effect transistor (MOSFET) structure formed in fin-like strips of semiconductor protrusions referred to as fins 58. The cross-section shown in FIG. 1 is taken along a longitudinal axis of the fin in a direction parallel to the direction of the current flow between the source and drain regions 54. The fin 58 may be formed by patterning the substrate using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, reactive ion etching (RIE). FIG. 1 illustrates a single fin 58, although the substrate 50 may comprise any number of fins.

Shallow trench isolation (STI) regions 62 formed along opposing sidewalls of the fin 58 are illustrated in FIG. 1. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of the fins 58 protrudes from surrounding insulating STI regions 62. In some cases, the patterned hard mask used to form the fins 58 may also be removed by the planarization process.

In some embodiments, the gate structure 68 of the FinFET device 60 illustrated in FIG. 1 is a high-k, metal gate (HKMG) gate structure that may be formed using a gate-last process flow. In a gate last process flow a sacrificial dummy gate structure (not shown) is formed after forming the STI regions 62. The dummy gate structure may comprise a dummy gate dielectric, a dummy gate electrode, and a hard mask. First, a dummy gate dielectric material (e.g., silicon oxide, silicon nitride, silicon oxynitride, or the like) may be deposited. Next, a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins 58 and extend between the fins 58 over the surface of the STI regions 62. As described in greater detail below, the dummy gate structure may be replaced by the gate structure 68 as illustrated in FIG. 1. The gate structure 68 illustrated in the right side in FIG. 1 (seen on the top of fin 58) is an example of an active gate structure which extends, e.g., along sidewalls of and over the portion of fin 58 protruding above the STI region 62. The gate structure 68 in the left side in FIG. 1 is an example gate structure extending over the STI region 62, such as between adjacent fins 58. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

Source and drain regions 54 and spacers 72 of FinFET 60, illustrated in FIG. 1, are formed, for example, self-aligned to the dummy gate structures. Spacers 72 may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin 58 (as illustrated in the right side of FIG. 1) or the surface of the STI region 62 (as illustrated in the left side of FIG. 1).

Source and drain regions 54 are semiconductor regions in contact with the fin 58. In some embodiments, the source and drain regions 54 may comprise heavily-doped regions and relatively lightly-doped drain (LDD) extensions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source and drain regions 54 may comprise an epitaxially grown region. For example, after forming the LDD regions, the spacers 72 may be formed and, subsequently, the heavily-doped source and drain regions may be formed self-aligned to the spacers 72. In particular, the heavily-doped source and drain regions may be formed by first etching the fins to form recesses, and then depositing a crystalline semiconductor material in the recess by a selective epitaxial growth (SEG) process that may fill the recess and, typically, extend beyond and above the original surface of the fin to form a raised source-drain structure, as illustrated in FIG. 1. The crystalline semiconductor material may be elemental (e.g., Si, or Ge, or the like), or an alloy (e.g., $Si_{1-x}C_x$, or $Si_{1-x}Ge_x$, $Si_{1-x-y}Ge_xC_y$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 54 either in situ during SEG, or by an ion implantation process performed after the SEG, or by a combination thereof. The source and drain regions 54 may be formed by other processes, such as ion implantation of dopants, and the like.

Still referring to FIG. 1, a first interlayer dielectric (ILD) layer 76 is deposited over the structure. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer 76.

The HKMG gate structures 68, illustrated in FIG. 1, may then be formed by first removing the dummy gate structures using one or more etching techniques, thereby creating recesses between respective spacers 72. Next, a replacement gate dielectric layer 66 comprising one or more dielectrics, followed by a replacement conductive gate layer 64 comprising one or more conductive materials, may be deposited to completely fill the recesses. The gate dielectric layer 66 includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, combinations thereof, or multilayers thereof. In some embodiments, the conductive gate layer 64 may be a multilayered metal gate stack comprising a barrier layer, a work function layer, and a gate-fill layer formed successively on top of gate dielectric layer 66. Example materials for a barrier layer include TiN, TaN, Ti, Ta, TiSiN, TaSiN, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like. Excess portions of the gate structure layers 64 and 66 may be removed from over the top surface of first ILD layer 76 using, for example a CMP process. The resulting structure, as illustrated in FIG. 1, may be a substantially coplanar surface comprising an exposed top surface of the first ILD layer 76, the spacers 72, and remaining portions of the HKMG gate layers (i.e., the gate structure layers 64 and 66) inlaid between respective spacers 72.

A second ILD layer 78 may be deposited over the first ILD layer 76, as illustrated in FIG. 1. In some embodiments, the insulating materials to form the first ILD layer 76 and the second ILD layer 78 may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer 76 and the second ILD layer 78 may be deposited using any suitable method, such as CVD, PVD, ALD, PEALD, PECVD, SACVD, FCVD, spin-on, and/or the like, or a combination thereof. In some embodiments, one or more etch stop layers (not specifically illustrated) are also formed over the structure above and/or below the illustrated ILD layers.

As illustrated in FIG. 1, electrodes of electronic devices formed in the substrate 50 may be electrically connected to conductive features of a first interconnect level (formed subsequently in later figures) using conductive connectors (e.g., contact plugs 74) formed through the intervening dielectric layers. In the example illustrated in FIG. 1, the contact plugs 74 make electrical connections to the source and drain regions 54 of FinFET 60. Contact plugs 74 to gate electrodes are typically formed over STI regions 62. A separate gate electrode 64 (shown in the left in FIG. 1) illustrates such contacts. The contact plugs 74 may be formed using photolithography techniques. For example, a patterned mask may be formed over the second ILD layer 78 and used to etch openings that extend through the second ILD layer 78 to expose a portion of gate electrodes 64 over STI regions 62, as well as etch openings over the fins 58 that extend further, through the first ILD layer 76 and the CESL (not shown) liner below first ILD layer 76 to expose portions of the source and drain regions 54. In some embodiments, an anisotropic dry etch process may be used wherein the etching is performed in two successive steps. The etchants used in the first step of the etch process have a higher etch rate for the materials of the first and second ILD layers 76 and 78 relative to the etch rate for the materials used in the conductive gate layer 64 and the CESL, which may be lining the top surface of the heavily-doped regions of the source and drain regions 54. Once the first step of the etch process exposes the CESL, the second step of the etch process may be performed wherein the etchants may be switched to selectively remove the CESL. While the two ILD layers (e.g., the first ILD layer 76 and the second ILD layer 78) are illustrated, embodiments having only a single ILD layer, or having three or more ILD layers, are within the contemplated scope of this disclosure.

In some embodiments, a conductive liner may be formed in the openings in the first ILD layer 76 and the second ILD layer 78. Subsequently, the openings are filled with a conductive fill material. The liner comprises barrier metals used to reduce out-diffusion of conductive materials from the contact plugs 74 into the surrounding dielectric materials. In some embodiments, the liner may comprise two barrier metal layers. The first barrier metal comes in contact with the semiconductor material in the source and drain regions 54 and may be subsequently chemically reacted with the heavily-doped semiconductor in the source and drain regions 54 to form a low resistance ohmic contact, after which the unreacted metal may be removed. For example, if the heavily-doped semiconductor in the source and drain regions 54 is silicon or silicon-germanium alloy semiconductor, then the first barrier metal may comprise Ti, Ni, Pt, Co, other suitable metals, or their alloys. The second barrier metal layer of the conductive liner may additionally include other metals (e.g., TiN, TaN, Ta, or other suitable metals, or their alloys). A conductive fill material (e.g., W, Al, Cu, Ru, Ni, Co, alloys of these, the like, or any combination thereof) may be deposited over the conductive liner layer to fill the contact openings, using any acceptable deposition technique (e.g., CVD, ALD, PEALD, PECVD, PVD, ECP, electroless plating, the like, or any combination thereof). Next, a planarization process (e.g., CMP) may be used to remove excess portions of all the conductive materials from over the surface of the second ILD layer 78. The resulting conductive plugs extend into the first and second ILD layers 76 and 78 and constitute contact plugs 74 making physical and electrical connections to the electrodes of electronic devices, such as a tri-gate FinFET, as illustrated in FIG. 1. In this example, contacts to electrodes over STI region 62 and to electrodes over fins 58 are formed simultaneously using the same processing steps. However, in other embodiments these two types of contacts may be formed separately.

Figure 2:
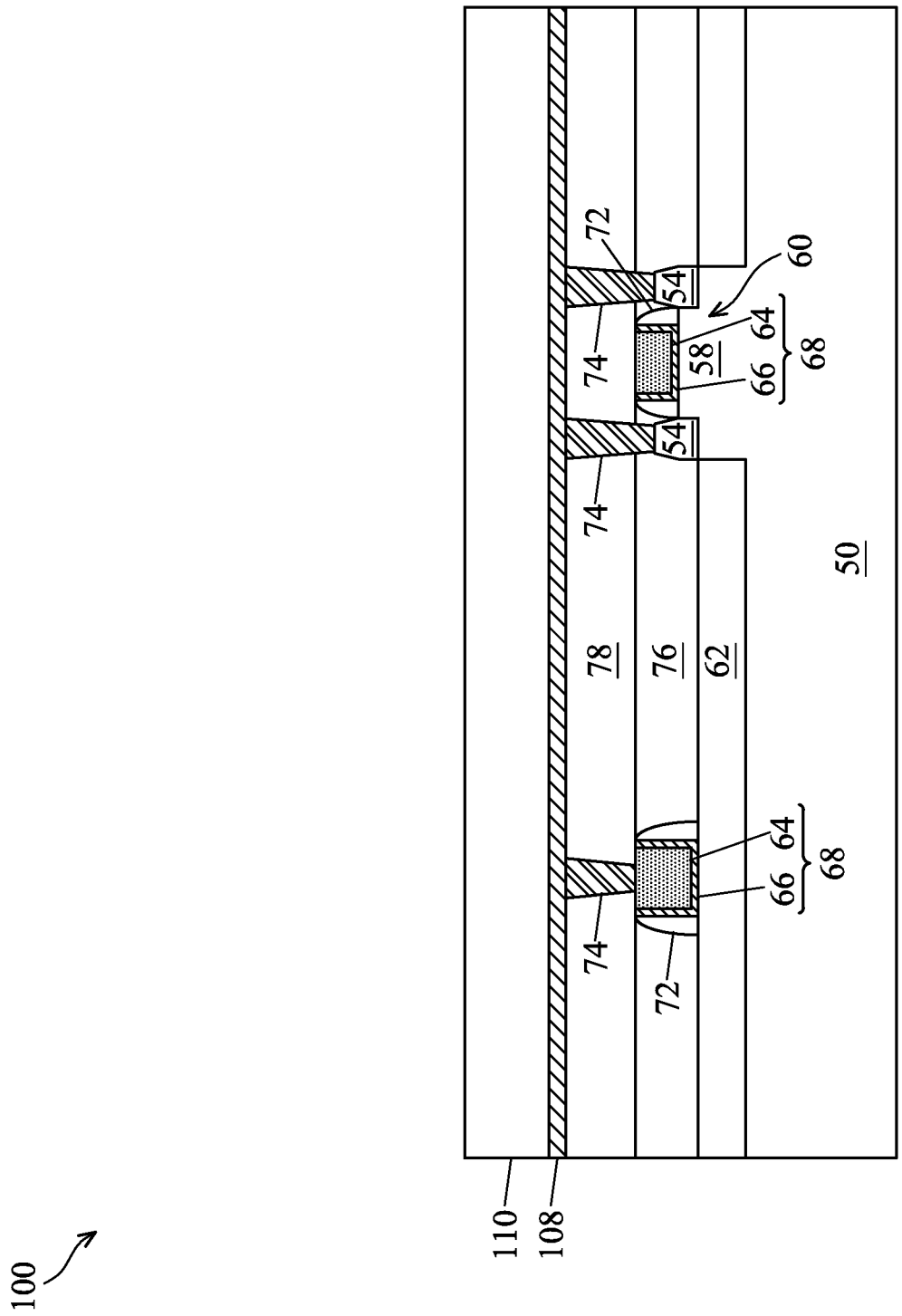

In FIG. 2, an etch stop layer 108 is formed over the FinFETs 60 and other electronic devices, the second ILD layer 78, and the contact plugs 74. The etch stop layer 108 may be formed from silicon carbide, silicon nitride, silicon oxynitride, silicon carbo-nitride, or the like. The etch stop layer 108 may be formed by chemical vapor deposition (CVD), physical vapor deposition (PVD), atomic layer deposition (ALD), a spin-on-dielectric process, the like, or a combination thereof. The etch stop layer 108 may be formed to a thickness of about 20 Å to about 200 Å, such as about 100 Å.

Still referring to FIG. 2, an inter-metal dielectric (IMD) layer 110 is formed over the etch stop layer 108. The IMD layer 110 may be a layer formed from a low-k dielectric material having a k-value lower than about 3.0. The IMD layer 110 may be a layer formed from an extra-low-k (ELK) dielectric material having a k-value of less than 2.5. In some embodiments, the IMD layer 110 may be formed from an oxygen-containing and/or carbon containing low-k dielectric material, Hydrogen SilsesQuioxane (HSQ), MethylSilsesQuioxane (MSQ), or the like. The material of the etch stop layer 108 has a high etching selectivity with the IMD layer 110, and hence the etch stop layer 108 may be used to stop the etching of the IMD layer 110 in subsequent processing steps.

In some embodiments, the IMD layer 110 is formed from a porous material such as SiOCN, SiCN, SiOC, SiOCH, or the like and may be formed by initially forming a precursor layer over the etch stop layer 108. The precursor layer may include both a matrix material and a porogen interspersed within the matrix material, or may alternatively include the matrix material without the porogen. In some embodiments the precursor layer may be formed, for example, by co-depositing the matrix and the porogen using a process such as plasma enhanced chemical vapor deposition (PECVD) where the matrix material is deposited at the same time as the porogen, thereby forming the precursor layer with the matrix material and the porogen mixed together. However, as one of ordinary skill in the art will recognize, co-deposition using a simultaneous PECVD process is not the only process that may be used to form the precursor layer. Any suitable process, such as premixing the matrix material and the porogen material as a liquid and then spin-coating the mixture onto the etch stop layer 108, may also be utilized.

The matrix material, or base dielectric material, may be formed using a process such as PECVD, although any suitable process, such as a CVD, PVD, or even spin-on coating, may alternatively be utilized. The PECVD process may utilize precursors such as methyldiethoxysilane (DEMS), although other precursors such as other silanes, alkylsilanes (e.g., trimethylsilane and tetramethylsilane), alkoxysilanes (e.g., methyltriethoxysilane (MTEOS), methyltrimethoxysilane (MTMOS), methyldimethoxysilane (MDMOS), trimethylmethoxysilane (TMMOS) and dimethyldimethoxysilane (DMDMOS)), linear siloxanes and cyclic siloxanes (e.g., octamethylcyclotetrasiloxane (OMCTS) and tetramethylcyclotetrasiloxane (TMCTS)), combinations of these, or the like may alternatively be utilized. However, as one of ordinary skill in the art will recognize, the materials and processes listed herein are merely illustrative and are not meant to be limiting to the embodiments, as any other suitable matrix precursors may alternatively be utilized.

The porogen may be a molecule that can be removed from the matrix material after the matrix material has set in order to form pores within the matrix and thereby reduce the overall value of the dielectric constant of the IMD layer 110. The porogen may be a material that is big enough to form the pores while also remaining small enough such that the size of the individual pores does not overly displace the matrix material. As such, the porogen may include an organic molecule such as alpha-terpinene (ATRP) (1-Isopropyl-4-Methyl-1,3-Cyclohexadiene) or cyclooctane (boat shape) or 1,2-bis(triethoxysilyl) ethane silicon.

After the precursor layer has been formed with the porogen dispersed within the matrix material, the porogen is removed from the matrix material to form the pores within the matrix material. In an embodiment the removal of the porogen is performed by an annealing process which can break down and vaporize the porogen material, thereby allowing the porogen material to diffuse and leave the matrix material, thereby leaving behind a structurally intact porous dielectric material as the IMD layer no. For example, an anneal of in a range from about 200° C. to about 500° C., such as about 400° C., for in a range from about 10 seconds to about 600 seconds, such as about 200 seconds, may be utilized. Alternatively, other suitable processes may be used to remove the porogen, such as irradiating the porogen with ultraviolet (UV) radiation to decompose the porogen or utilizing microwaves to decompose the porogen.

Figure 3:
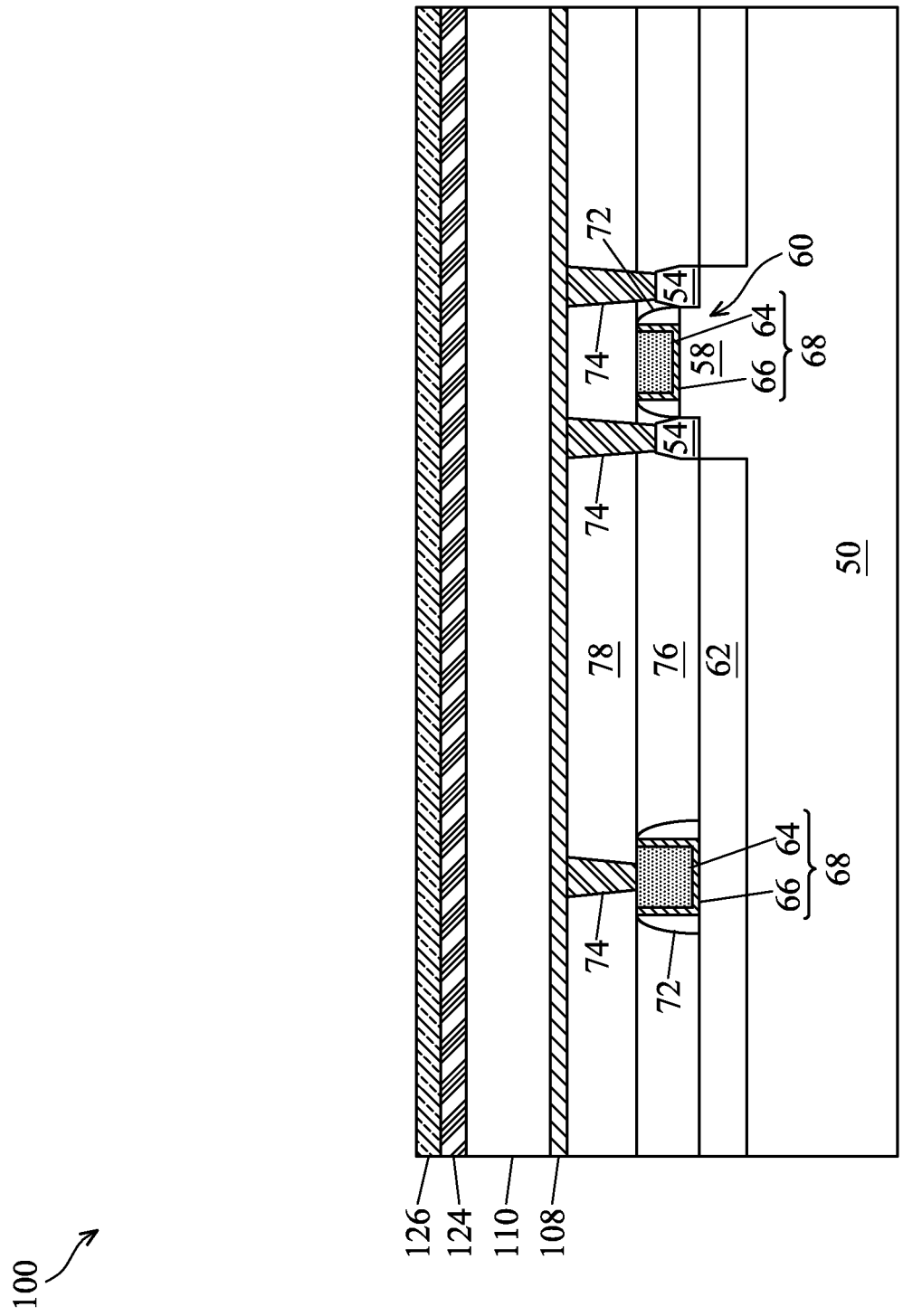

In FIG. 3, a film stack is formed over the IMD layer 110. In accordance with some embodiments, the film stack is used to form conductive lines that are electrically connected to the contact plugs 74 and substrate 50. The film stack includes a buffer layer 124 and a mask layer 126. In some embodiments, the film stack includes more than one buffer layer and mask layer, which may be formed in alternating fashion.

The buffer layer 124 is formed over the IMD layer 110, and the mask layer 126 is formed over the buffer layer 124. The buffer layer 124 may be formed from a dielectric, such as silicon oxide, and may be formed by CVD, PVD, ALD, a spin-on-dielectric process, or the like. The mask layer 126 may be formed from a material that includes a metal, such as titanium nitride, titanium, tantalum nitride, tantalum, or the like, and may be formed by PVD, Radio Frequency PVD (RFPVD), ALD, or the like. In subsequent processing steps, a pattern is formed on the mask layer 126. The mask layer 126 is then used as an etching mask, where the pattern of the mask layer 126 is used to etch the IMD layer 110. The buffer layer 124 provides stress reduction between the IMD layer 110 and the mask layer 126.

Figure 4:
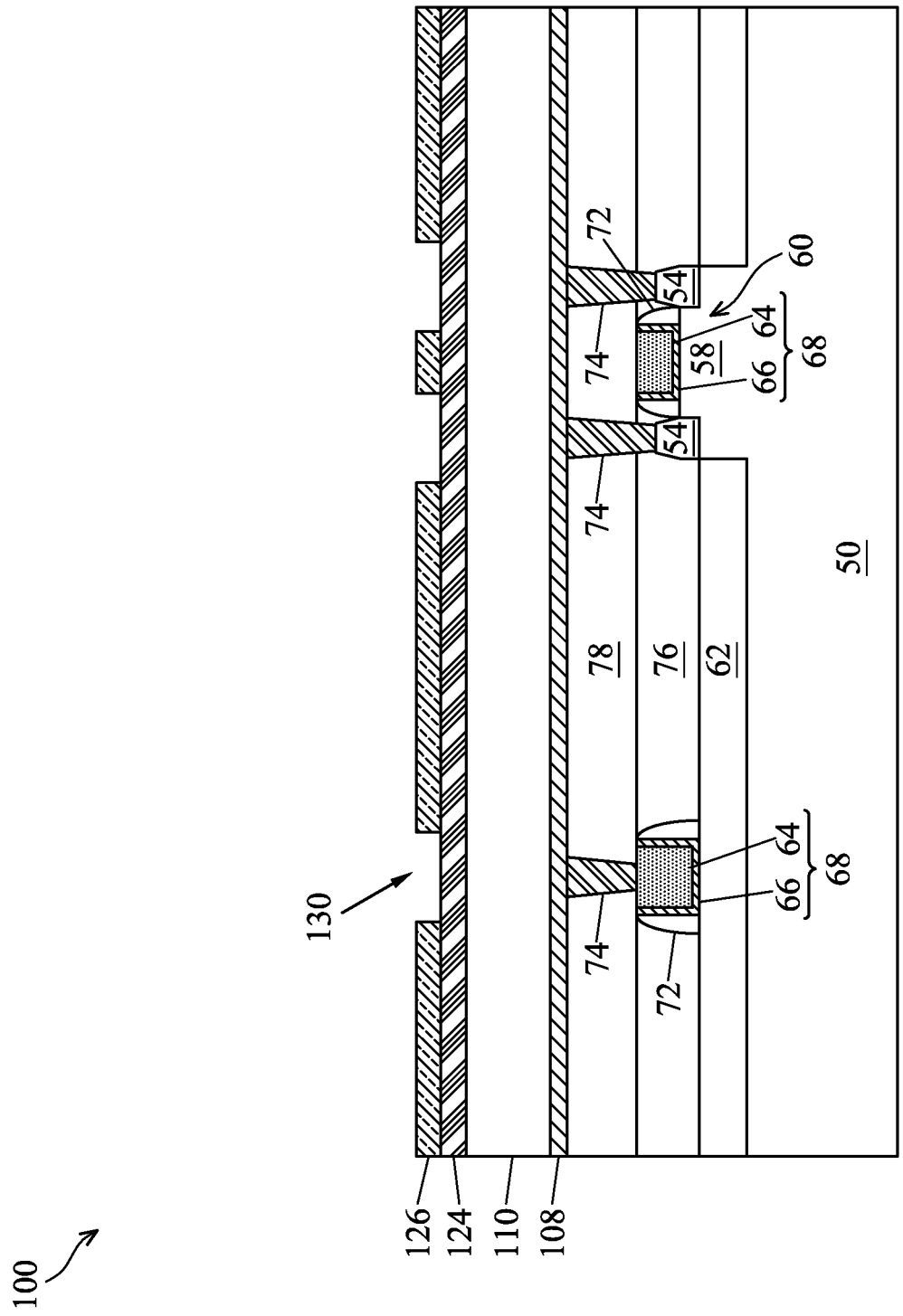

In FIG. 4, openings 130 are formed in the mask layer 126. Formation of the openings 130 may include performing a photolithography process to etch the mask layer 126 in order to form initial openings. The photolithography process may include forming a photoresist (not specifically illustrated) over the mask layer 126, patterning the photoresist with openings corresponding to the openings 130 extending the openings 130 through the mask layer 126, and then removing the photoresist.

Figure 5:
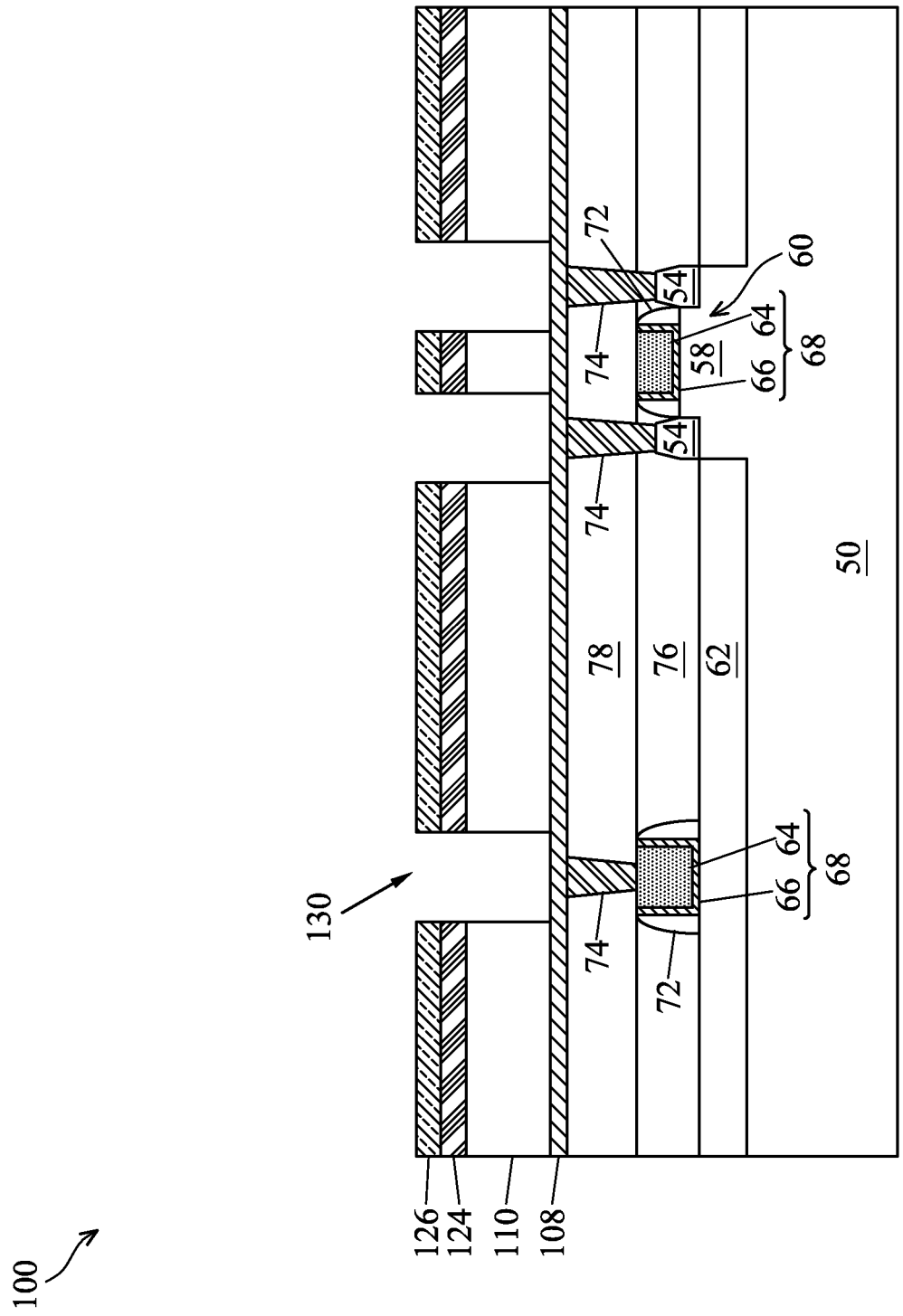

In FIG. 5, the openings 130 are extended through the buffer layer 124 and the IMD layer 110. The openings 130 may be extended by using acceptable etching techniques. In an embodiment, the openings 130 are formed by an anisotropic dry etch process. For example, the etching process may include a dry etch process using a reaction gas that selectively etches the IMD layer 110 without significantly etching the mask layer 126. The etching process is performed until the openings 130 expose the etch stop layer 108. For example, the etching process may include the formation of a reactive species from an etchant gas using a plasma. In some embodiments, the plasma may be a remote plasma. The etchant gas may include a fluorocarbon chemistry such as $C_4F_6/CF_4/C_5F$ and $NF_3/O_2/N_2/Ar/H_3/H_2$, the like, or a combination thereof. In some embodiments, the etchant uses fluorocarbon chemistry with $O_2$ or Ar as the carrier gas.

Figure 6:
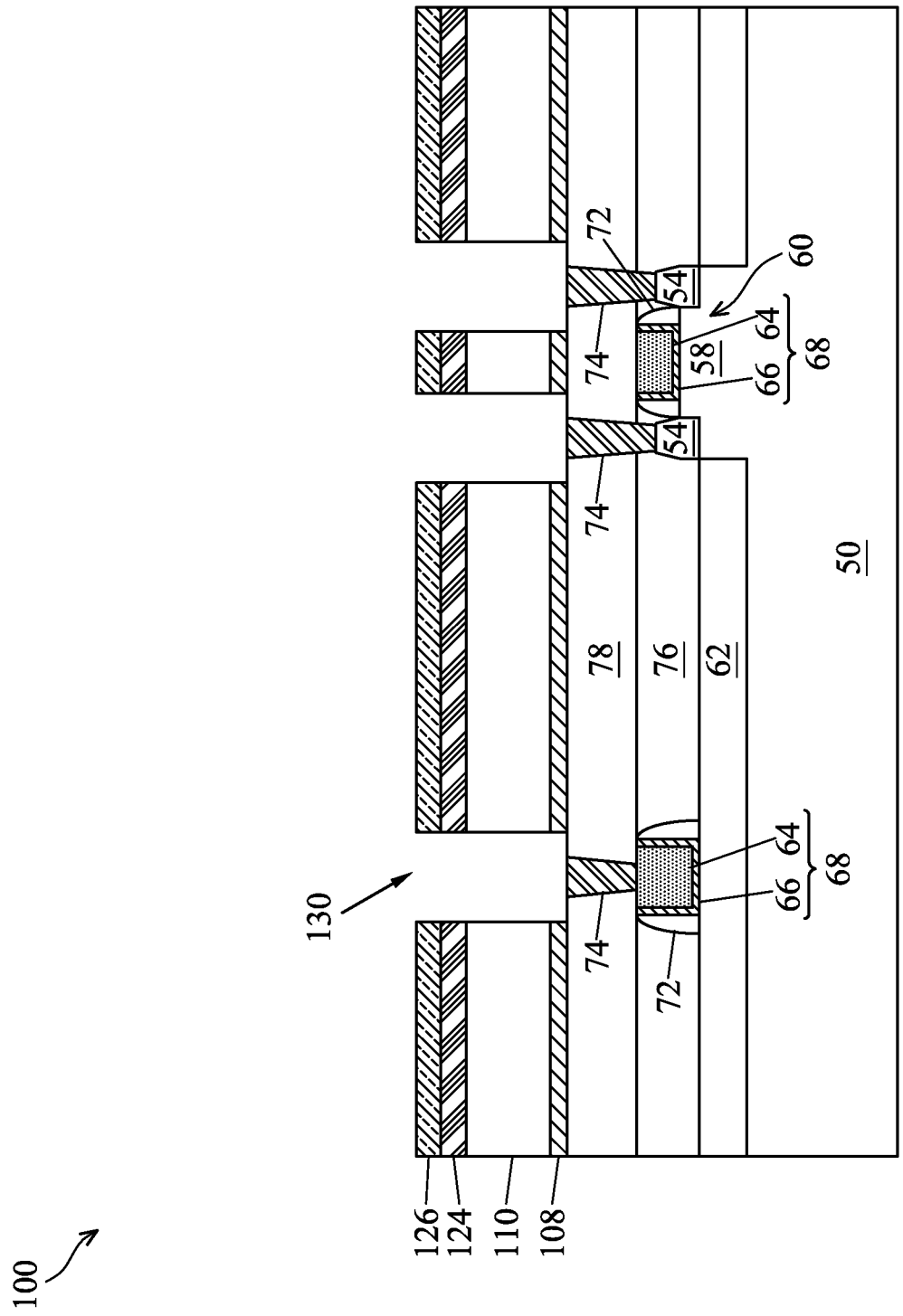

In FIG. 6, portions of the etch stop layer 108 in the openings 130 are removed to expose the underlying target contact plugs 74. The etch stop layer 108 may be removed using an anisotropic wet or dry etch that is selective to the material of the etch stop layer 108. For example, the etch stop layer 108 may be removed using an anisotropic wet etch that uses etchant reactants such as $H_2O_2$. The etching process used to remove the etch stop layer 108 may be different from the etching processes used to form the openings 130 (e.g., different etchants and/or other etching process parameters may be used).

Figure 7:
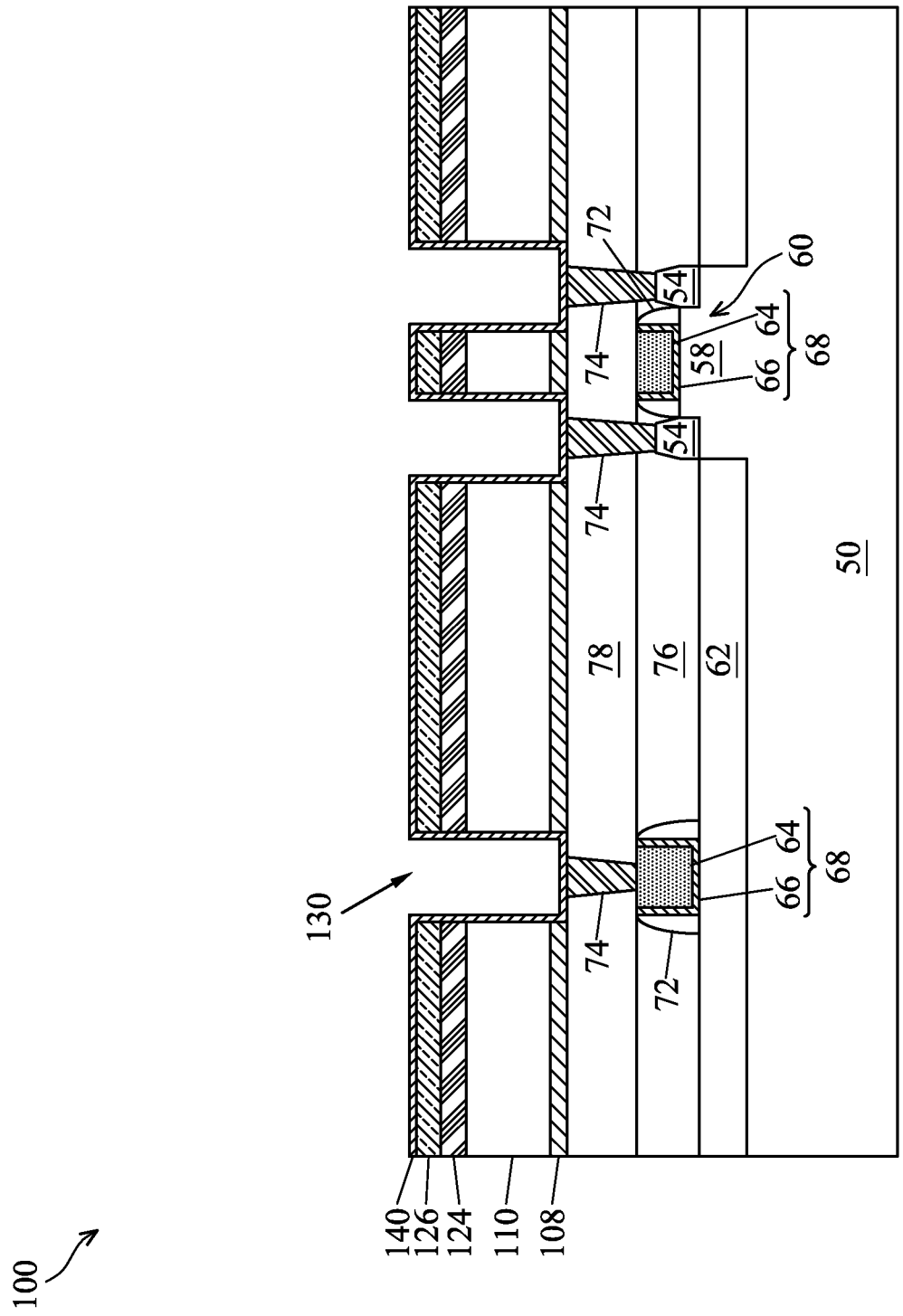

In FIG. 7, a barrier layer 140 is formed on the exposed surface of wafer 100 and in the openings 130. In accordance with some embodiments, the formation of the barrier layer 140 may include PVD, ALD, or a combination thereof. In some exemplary deposition process, Ar is introduced into the respective deposition chamber (not shown), in which wafer 100 is placed, to sputter metal ions (such as titanium ($Ti^+$) or tantalum ($Ta^+$)) or atoms without charges (such as titanium (Ti) or tantalum (Ta)) from the respective target (not shown) used in the PVD. Nitrogen may be added into the process gases. The sputtered metal ions are deposited onto wafer 100, forming the barrier layer 140, which is conductive. In the deposition of the barrier layer 140, a DC power and/or a radio frequency (RF) power may be applied. After deposition, the barrier layer 140 includes portions directly over the IMD layer 110, portions on the sidewalls of the openings 130 (e.g., sidewalls of the mask layer 126, the buffer layer 124, the IMD layer 110, and the etch stop layer 108), and portions at the bottom of the openings 130.

Figure 8:
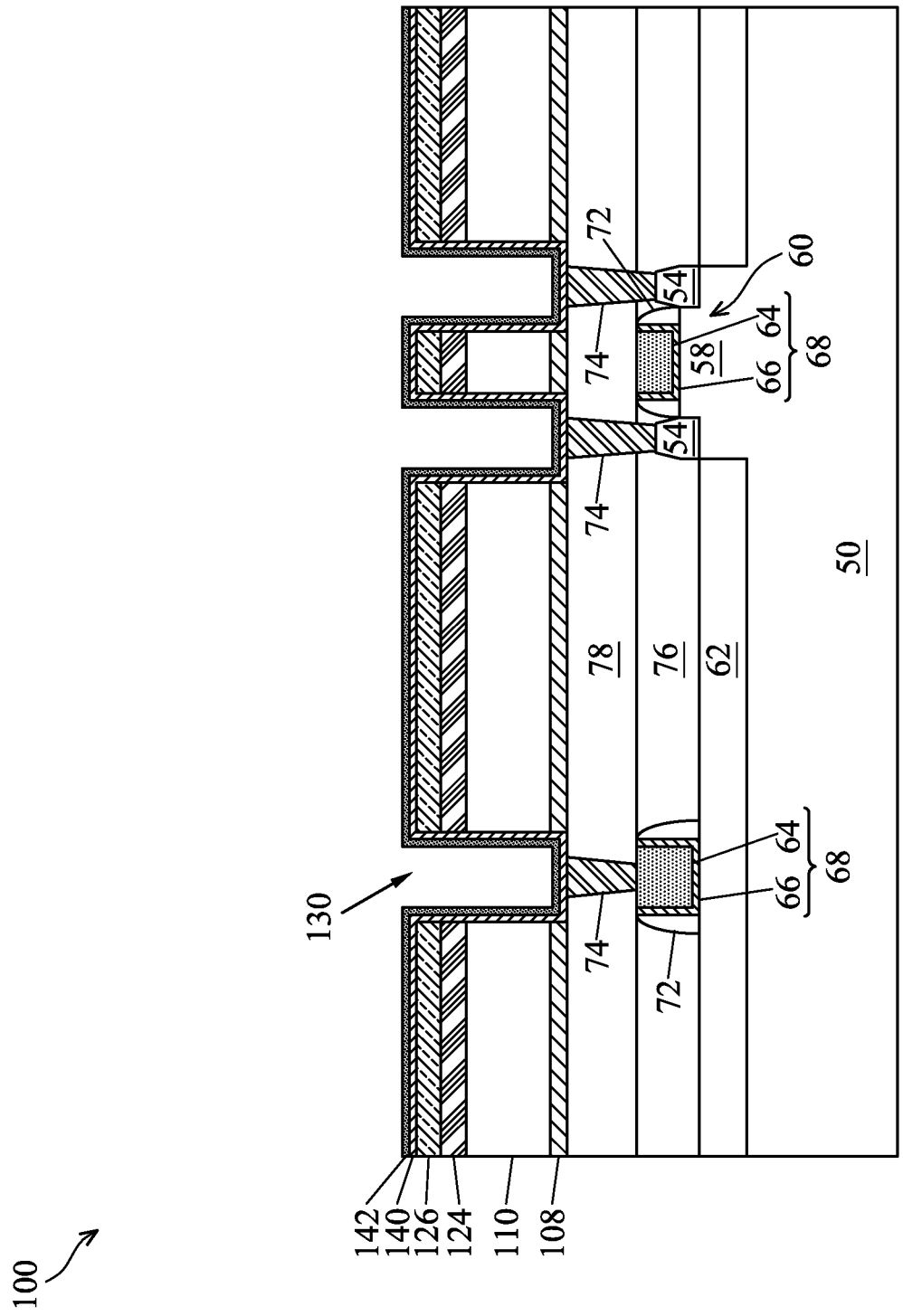

In FIG. 8, a first liner layer 142 is formed on the exposed surface of the wafer 100 and in the openings 130. The first liner layer 142 may be formed from ruthenium, molybdenum, rhodium, or the like, and may be formed by a deposition process such as CVD, PVD, ALD, the like, or a combination thereof. In accordance with some embodiments, the first liner layer 142 may be formed with a CVD process by flowing a precursor molecule containing ruthenium attached to one or more alkyl groups (e.g., hexadiene, pyridine, butadiene, and cycloheptadiene), one or more carbonyl groups, one or more other functional groups, or combinations thereof. For example, the first liner layer 142 may be formed by CVD using tricarbonyl-hexadiene ruthenium as the precursor molecule. The first liner layer 142 may be formed to a thickness of about 5 or 6 Å to about 20 Å, such as about 12 Å. Depending on the method of formation, a minimum thickness of about 5 or 6 Å may allow for at least a full monolayer of coverage of the first liner layer 142.

Figure 9:
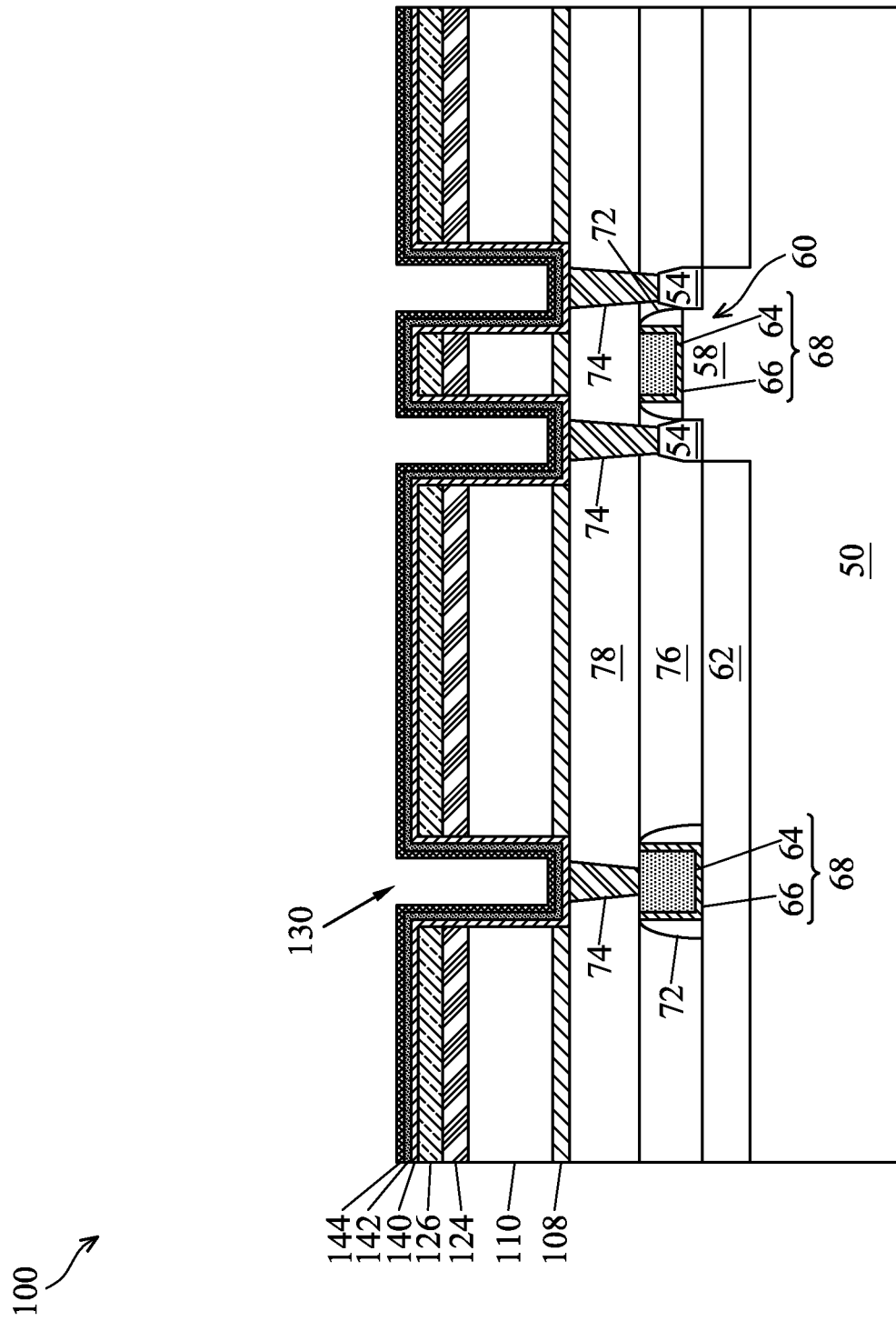

In FIG. 9, a second liner layer 144 is formed over the first liner layer 142 on the exposed surface of the wafer 100. The second liner layer 144 may be formed from cobalt, tantalum, magnesium, or the like, and may be formed by a deposition process such as CVD, PVD, ALD, or the like. In accordance with some embodiments, the second liner layer 144 may be formed with a CVD process by flowing a molecule containing cobalt attached to one or more alkyl groups, one or more carbonyl groups, one or more other functional groups, or combinations thereof. A benefit of forming the cobalt of the second liner layer 144 over the ruthenium of the first liner layer is that the cobalt may adhere to the ruthenium better than it would adhere to the barrier layer 140 (e.g., TaN). The second liner layer 144 may be formed to a thickness of about 10 Å to about 30 Å, or about 10 Å to about 25 Å, such as about 18 Å. As discussed in more detail below, although typically a minimum deposition of 5 to 6 Å may allow for a full monolayer of coverage, a thickness of the second liner layer 144 greater than or about 10 Å may help control intermixing of the first liner layer 142 and the second liner layer 144 such that a resulting top surface of the combined liner layer has a sufficient proportion of the material of the second liner layer 144 (e.g., cobalt) to reduce electromigration from overlying layers (e.g., a cobalt capping layer discussed below) during use of the completed device, as discussed in greater detail below. In addition, a thickness of the second liner layer 144 less than or about 30 Å may improve the degree of intermixing between the first liner layer 142 and the second liner layer 144 resulting in a sufficient amount of the material of the first liner layer 142 (e.g., ruthenium) along the top surface of the combined liner layer to achieve benefits related to dewettability of an overlying layer (e.g., a conductive material), as discussed in greater detail below. In some embodiments, thicknesses of the first liner layer 142 and the second liner layer 144 may be selected such that a sum of the thicknesses is about 20 Å to about 40 Å while remaining within the above-described preferred ranges for the first liner layer 142 and the second liner layer 144.

A benefit to forming the first liner layer 142 (e.g., ruthenium) directly onto the barrier layer 140 (e.g., TaN) before forming the second liner layer 144 (e.g., cobalt) is that the first liner layer 142 may have a stronger adherence to the barrier layer 140 than the second liner layer 144 would have to the barrier layer 140. As such, the first liner layer 142 and the second liner layer 144, together, exhibit a more robust coverage. Indeed, while a second liner layer 144 of, for example, cobalt deposited directly over the barrier layer 140 may exhibit a coverage of about 70% or greater, a first liner layer 142 of, for example, ruthenium, deposited directly over the barrier layer 140 (as described above) may exhibit a coverage of about 90% or greater.

Figure 10:
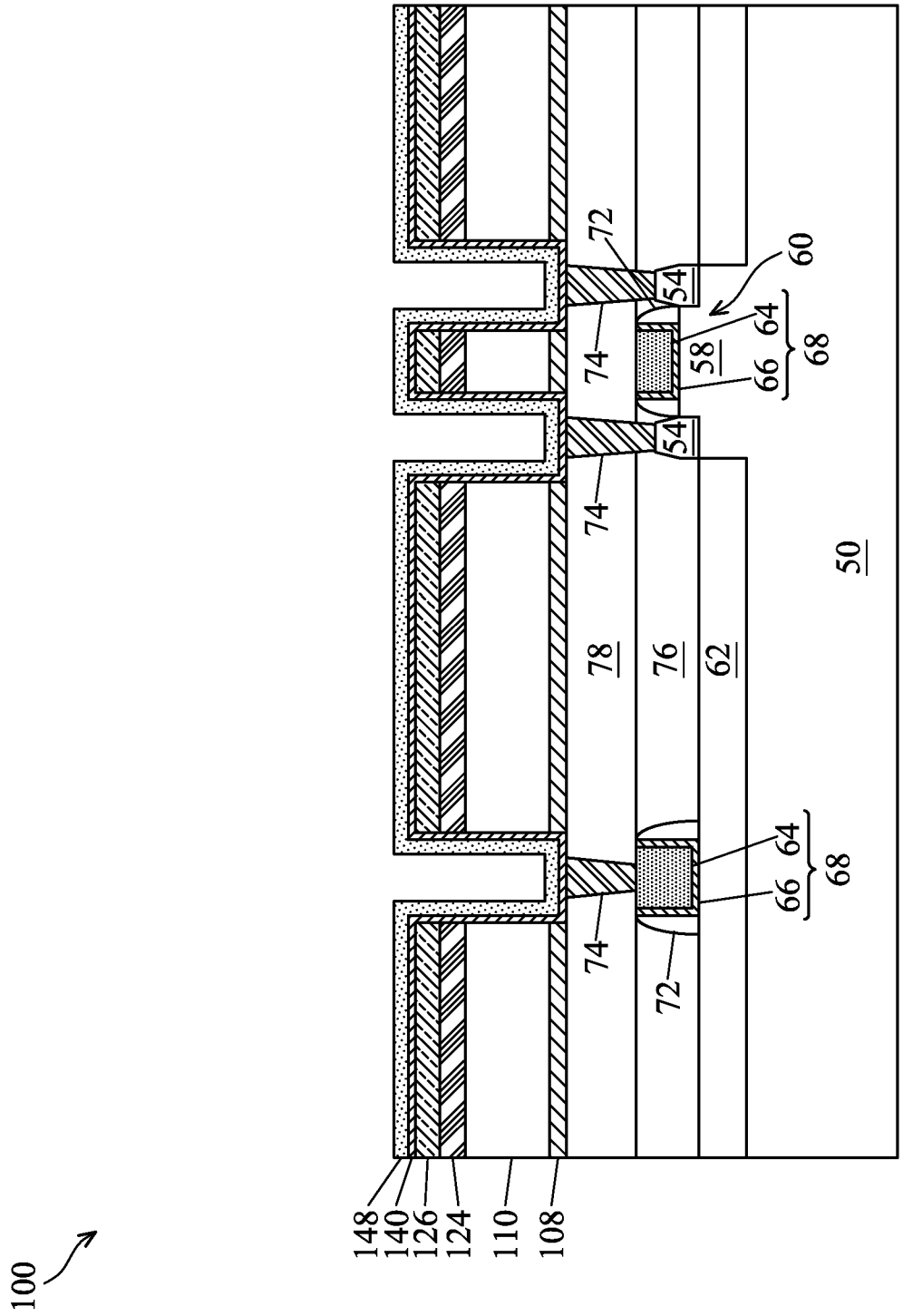

In FIG. 10, a combined liner layer 148 may be formed by performing a hydrogen soak treatment and/or a hydrogen plasma treatment on the wafer 100. During the hydrogen soak treatment, hydrogen gas diffuses into the combined liner layer 148 to repair deformities and reorient the molecules, which facilitates an intermixing between the first liner layer 142 and the second liner layer 144. The hydrogen soak treatment may be performed at an elevated temperature of between about 100° C. and about 400° C., such as about 200° C., and at an elevated pressure of between about 10 Torr and about 50 Torr, such as about 35 Torr. The hydrogen plasma treatment may also facilitate intermixing between the first liner layer 142 and the second liner layer 144. In addition, hydrogen ions bombard the first liner layer 142 and the second liner layer 144 to remove carbon and oxygen impurities from within those layers while also increasing the metal diffusivity. In accordance with some embodiments, the hydrogen plasma treatment includes bombarding the wafer 100 with hydrogen plasma for a period of about 10 seconds to about 60 seconds, or about 30 seconds. The hydrogen plasma treatment may be performed at between about 100° C. and about 400° C. and at between about 1 and about 15

Torr, such as about 3-5 Torr. The flowrate of hydrogen plasma may be between about 1000 sccm (standard cubic centimeters per minute) and 12000 sccm and last between about 5 seconds and about 5 minutes, or about 24 seconds.

The hydrogen soak treatment and the hydrogen plasma treatment serve several objectives. For example, as a result of one or both of the treatments, an intermixing of the first liner layer 142 and the second liner layer 144 is facilitated, thereby causing an exposed top surface of the combined liner layer 148 to comprise about 5% to about 20% ruthenium. These proportions may be found in the final structure as well. In addition, the degree of intermixing may differ in an upper portion of the combined liner layer near upper portions of the openings 130 as compared to a lower portion of the combined liner layer near lower portions of the openings 130. The combined liner layer 148 may comprise a gradient in ruthenium and cobalt concentrations through the thickness such that from the lower surface (i.e., adjacent to the barrier layer 140) to the upper surface the cobalt concentration generally decreases while the ruthenium concentration generally increases. The intermixing is more effective when the first liner layer 142 and the second liner layer 144 together comprises about or less than 9 total monolayers.

Figure 11:
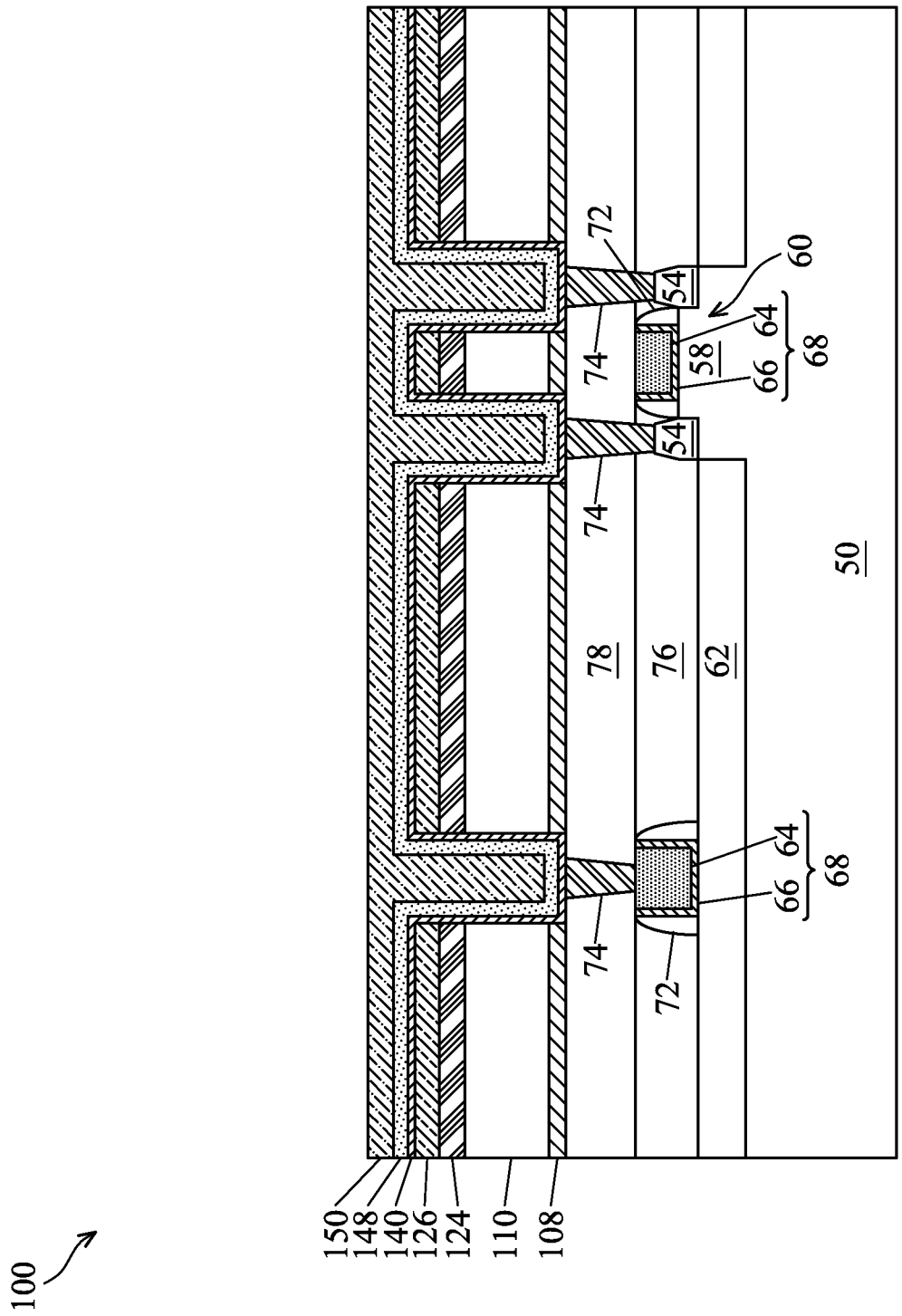

In FIG. 11, a conductive material 150 is filled into the openings 130. Excess conductive material 150 may also be formed along top surfaces of the combined liner layer 148. The conductive material 150 may be a metallic material including a metal or a metal alloy such as copper, silver, gold, tungsten, cobalt, aluminum, or alloys thereof. In some embodiments, the formation of the conductive material 150 includes depositing a thin seed layer (not shown), which may include copper or a copper alloy, and filling the rest of the openings 130 using CVD, PVD, ALD, ECP, high voltage ECP, or electro-less plating.

In accordance with some embodiments, a deposition method, such as PVD, may be used to form the conductive material 150 in the openings 130. For example, a first deposition of copper may be performed at room temperature, which may be followed by a reflow process at about 150° C. to about 300° C. for about 1 minute to about 5 minutes. One or more depositions of copper and reflow processes may follow the first cycle. In total, there may be one to five, or more, alternating cycles of depositions and reflow processes.

A benefit of the hydrogen plasma treatment in the previous step is that the resulting upper surface of the combined liner layer 148 having about 5% to about 20% ruthenium improves the efficiency and yield of filling the openings 130 with conductive material 150. In particular, the presence of ruthenium on the surface of the combined liner layer 148 provides improved deposition and reflow of the conductive material 150 by having increased Cu dewettability from the combined liner layer 148. In other words, the conductive material 150 (e.g., copper) is less likely to adhere immediately and strongly to the combined liner layer 148 upon contact. As such, the conductive material 150 is less likely to accumulate at upper portions of the openings 130, which may otherwise result in pinching across those upper portions. Instead, more of the conductive material 150 will reach and fill lower portions of the openings 130 before filling out the upper portions of the openings 130. In addition, to the extent accumulation and/or pinching of the conductive material 150 occur at upper portions of the openings 130, those occurrences will be reduced or alleviated by the reflow process(es) due to the improved mobility of the conductive material 150 over the ruthenium in the combined liner layer 148—that is, due to the enhanced dewettability between the layers. In either case, the openings 130 may be more effectively filled by the conductive material 150, thereby resulting in fewer or no voids. Indeed, a concentration of less than about 5% of ruthenium in the upper surface of the combined liner layer 148 may result in a large drop-off in the de-wettability of copper from the combined liner layer 148, which would reduce or substantially eliminate the above-described benefits related to the de-wettability. Further, a concentration of greater than about 20% of ruthenium in the upper surface of the combined liner layer 148 may correlate to a low overall concentration of cobalt in the combined liner layer 148, which may result in electromigration issues, as discussed in detail below.

Figure 12:
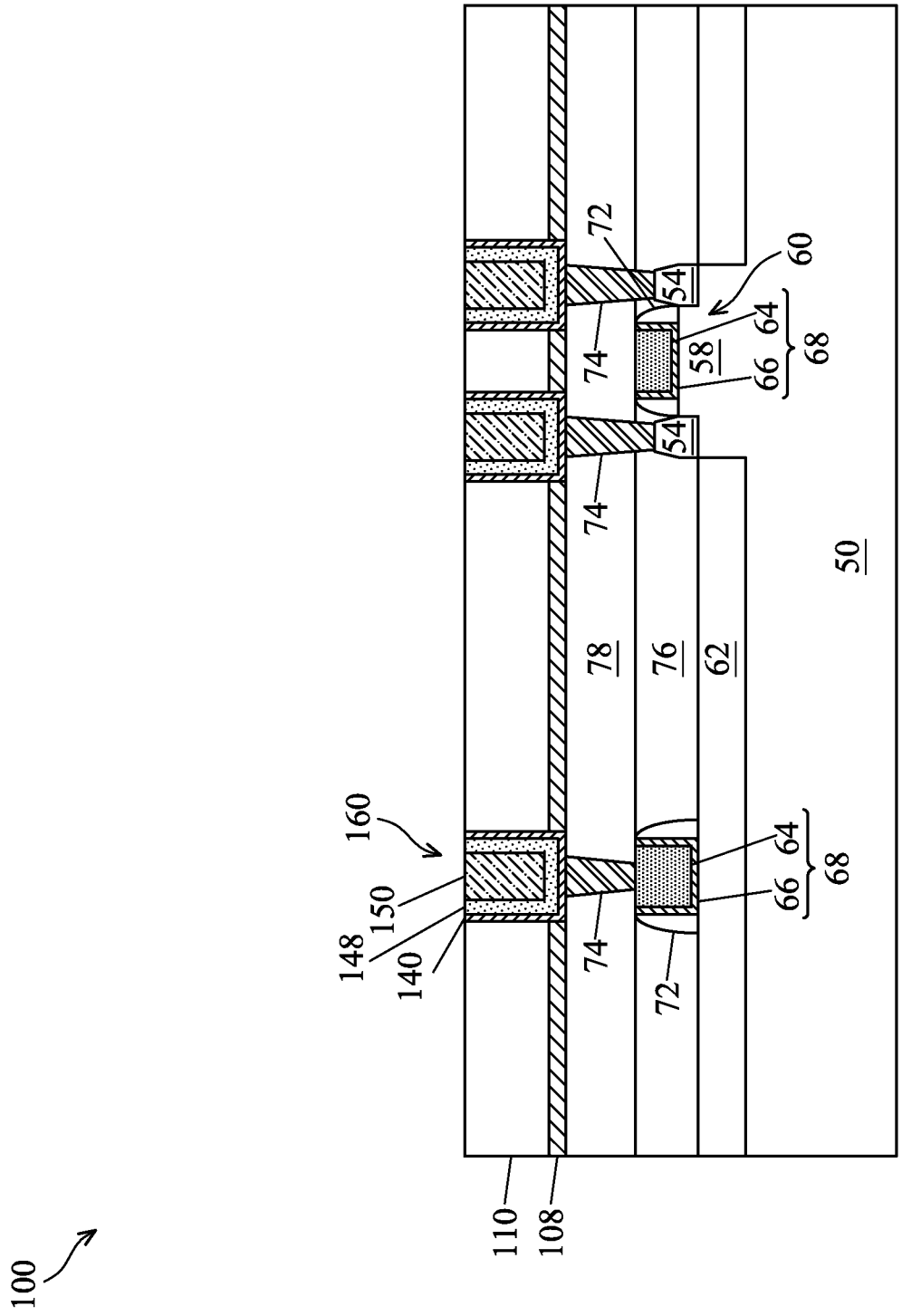

In FIG. 12, a planarization process may be performed to remove excess of the conductive material 150, the combined liner layer 148, and the barrier layer 140, thereby forming conductive lines 160 in the openings 130. In addition, the planarization process may remove remaining portions of the mask layer 126 and the buffer layer 124, thereby exposing the IMD layer 110. The planarization process may be a grinding or a CMP, and may be performed such that the top surfaces of the conductive material 150, the combined liner layer 148, the barrier layer 140, and the IMD layer 110 are level or are substantially level. The conductive lines 160 include remaining portions of the conductive material 150 and the remaining portions of the combined liner layer 148 and the barrier layer 140 extending along the sidewalls and bottoms of the conductive material 150. The conductive lines 160 are, therefore, physically and electrically connected to the contact plugs 74.

Figure 13:
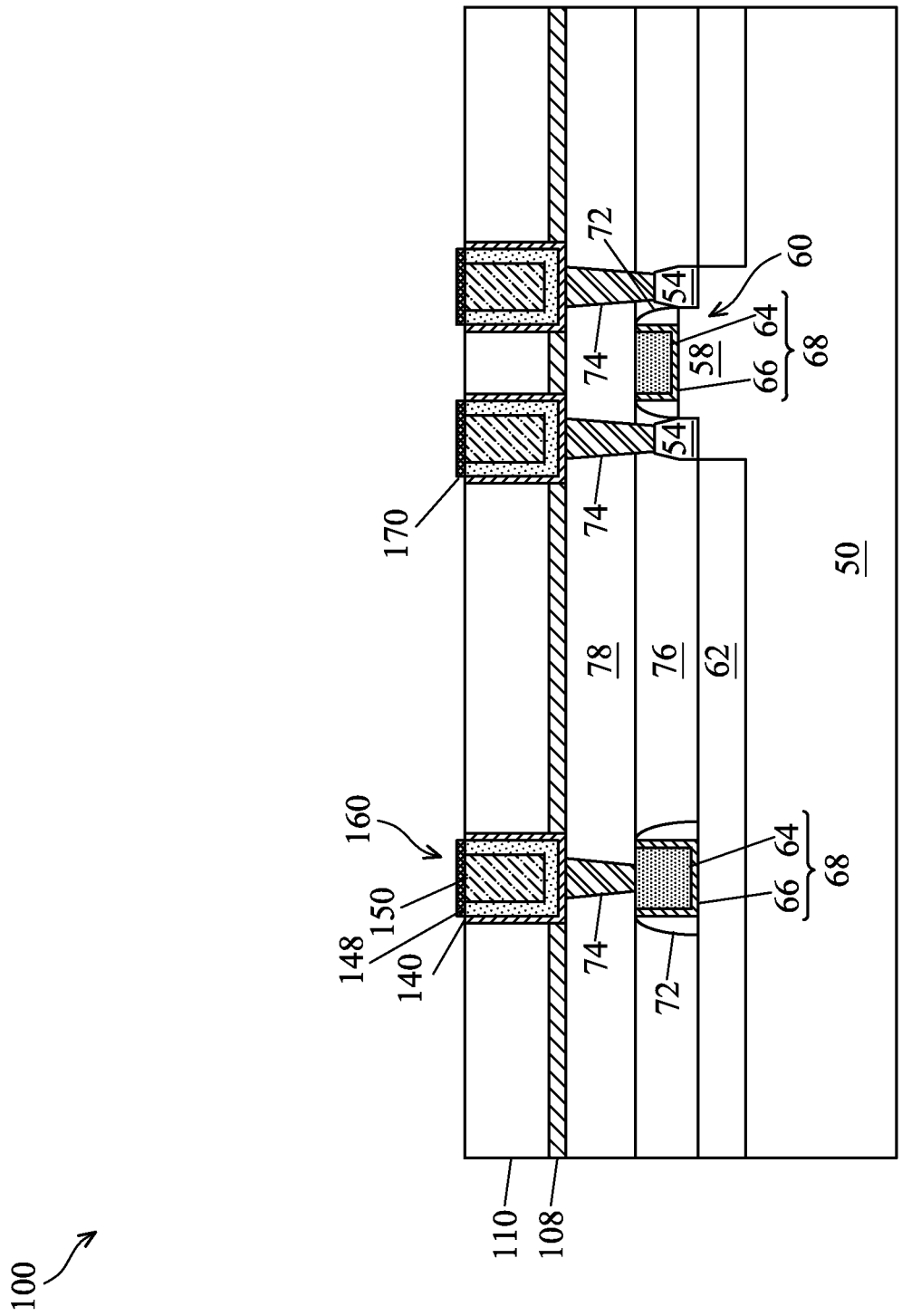

In FIG. 13, a capping layer 170 may be deposited over the IMD layer 110, the barrier layer 140, the combined liner layer 148, and the conductive material 150 using CVD, PECVD, PVD, ALD, PEALD, ECP, electroless plating, and/or the like. The capping layer 170 may comprise cobalt, ruthenium, the like, or any combination thereof. The capping layer 170 may be considered part of the conductive lines 160. In accordance with some embodiments, the capping layer 170 is deposited using CVD. The deposition may use a cobalt precursor that includes a molecule that comprises cobalt attached to carbon, oxygen, hydrogen, or combinations thereof. After depositing the material for the capping layer 170, excess portions may be removed with any suitable method, such as using lithography. As such, a photoresist (not specifically illustrated) may be formed over the material of the capping layer 170 and patterned to expose portions of the material of the capping layer 170 that are not directly over the conductive lines 160 (e.g., the combined liner layer 148 and the conductive material 150). The exposed portions may then be removed by etching or any suitable method. In some embodiments, the capping layer 170 is selectively deposited over the conductive material 150. In addition, portions of the capping layer 170 may also be deposited over the combined liner layer 148 and, perhaps, the barrier layer 140. The capping layer 170 may be deposited using any of the techniques identified with respect to the barrier layer 140, the first liner layer 142, the second liner layer 144, or the conductive material 150. The capping layer 170 may have a thickness of between about 15 Å and about 50 Å, in accordance with some embodiments.

In accordance with some embodiments and not specifically illustrated, before depositing the capping layer 170, upper portions of the conductive lines 160 (e.g., the conductive material 150 and the combined liner layer 148) may be etched and recessed by between about 0 Å and about 50

Å. Next, the material of the capping layer may be selectively deposited over the structure and into the recesses by one of the methods listed above.

A benefit of the second liner layer 144 may be realized with the presence of the capping layer 170 by a reduction of electromigration of the material of the capping layer 170 and the material of the conductive material 150 into the combined liner layer 148 during use of the completed semiconductor device. For example, using cobalt in the capping layer 170 may help reduce diffusion of copper from the conductive material 150 into the combined liner layer 148 due to cobalt having a strong adhesion with copper. In addition, using cobalt in the combined liner layer 148 may help reduce diffusion of cobalt from the capping layer 170 into the combined liner layer 148 due to a lesser diffusion gradient of cobalt as well as the strong adhesion between cobalt and copper. Indeed, while not every chip or wafer needs to be tested, as part of the process for producing reliable semiconductor devices, a subset of the chips or wafers need to be tested. As such, electromigration testing may be included to show that the devices meet certain electromigration specifications, such as sufficiently low electromigration of the material of the capping layer 170 into the combined liner layer 148. That is, the mere presence of the material in both layers (and, effectively, a reduced concentration gradient of the material between both layers) reduces the diffusion of that material from the capping layer 170 into the combined liner layer 148 during extended use of the semiconductor device.

Figure 14:
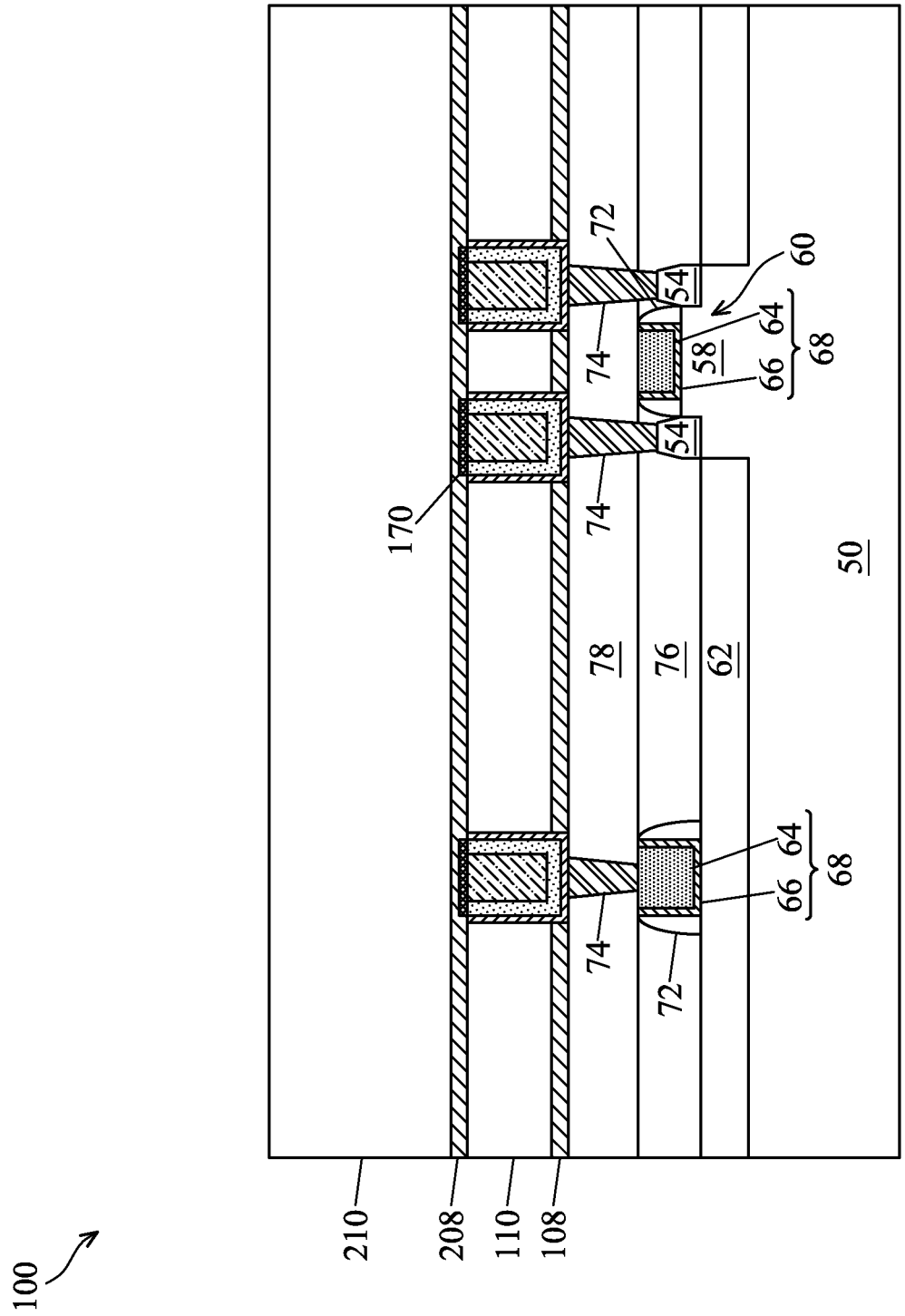

In FIG. 14, an etch stop layer 208 is formed over the IMD layer 110 and the conductive lines 160. The etch stop layer 208 may be formed of similar materials and by a similar process as described above in connection with the etch stop layer 108. The etch stop layer 208 may be formed to a thickness of about 20 Å to about 200 Å, such as about 100 Å.

Still referring to FIG. 14, an IMD layer 210 is formed over the etch stop layer 208. The IMD layer 210 may be formed of similar materials and by a similar process as described above in connection with the IMD layer 110. The material of the etch stop layer 208 has a high etching selectivity with the IMD layer 210, and hence the etch stop layer 208 may be used to stop the etching of the IMD layer 210 in subsequent processing steps.

Figure 15:
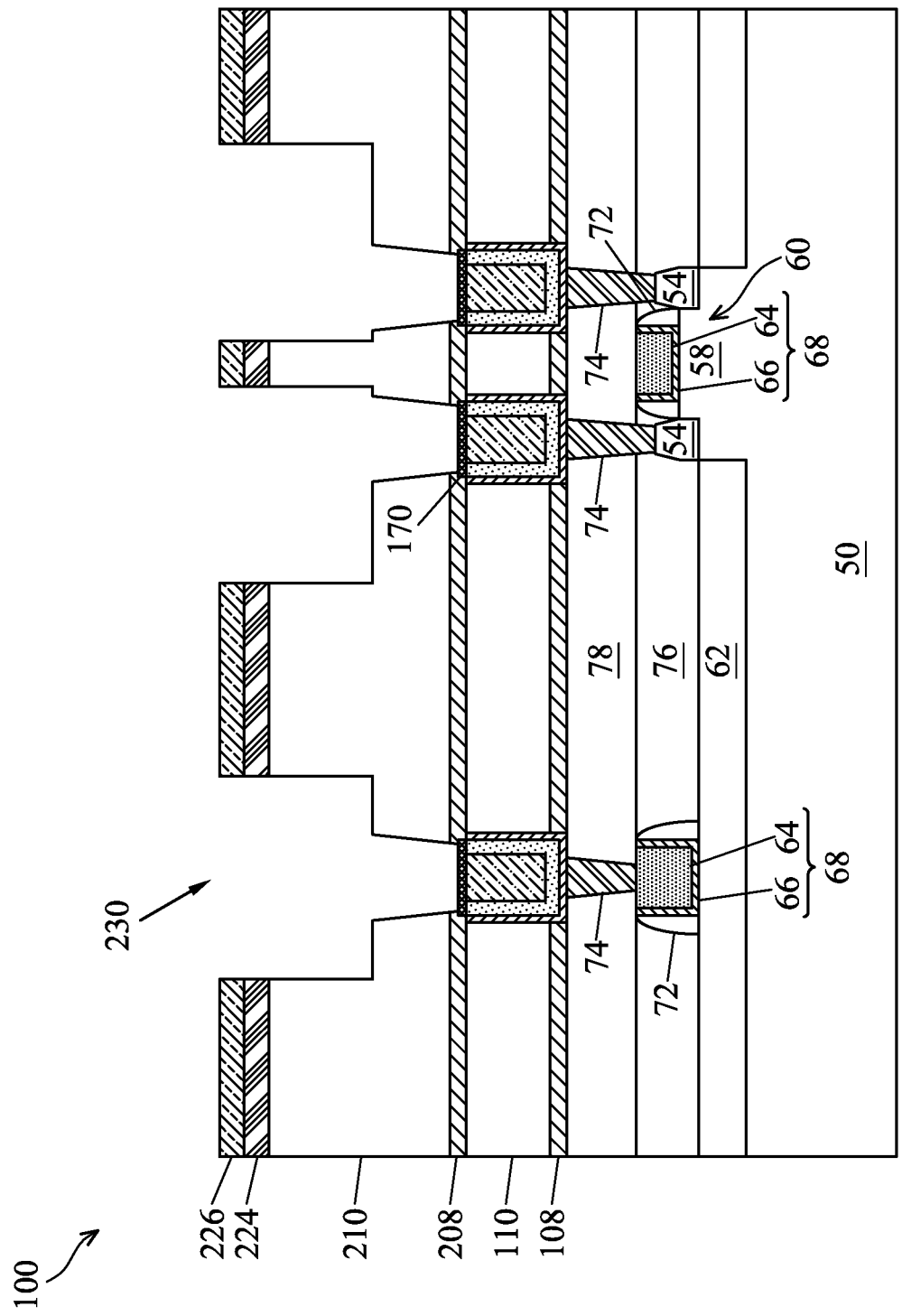

In FIG. 15, a film stack is formed over the IMD layer 210. In accordance with some embodiments, the film stack is used to form metallization lines and vias that are electrically connected to the conductive lines 160. The film stack includes a buffer layer 224 and a mask layer 226. In some embodiments, the film stack includes more than one buffer layer and mask layer, which may be formed in alternating fashion. The buffer layer 224 and the mask layer 226 may be formed of similar materials and by similar processes as described above in connection with the buffer layer 124 and the mask layer 126.

Still referring to FIG. 15, openings 230 are then formed in the mask layer 226, and the openings 230 are extended through the buffer layer 224, the IMD layer 210, and the etch stop layer 208. The openings 230 may be formed and extended by the acceptable etching techniques and etchants described above in connection with openings 130. The openings 230 expose the underlying conductive lines 160 (particularly, the capping layer 170, if used). The etch stop layer 208 may be removed using an anisotropic wet or dry etch that is selective to the material of the etch stop layer 208. For example, the etch stop layer 208 may be remove using an anisotropic wet etch that uses etchant reactants such as $H_2O_2$. The etching process used to remove the etch stop layer 208 may be different from the etching processes used to form the openings 230 (e.g., different etchants and/or other etching process parameters may be used).

As illustrated, the openings 230 may be patterned using a dual damascene process. As such, the upper portions of the openings 230 will house the metallization lines (see FIG. 18 below), and the lower portions of the openings 230 will house conductive vias (see FIG. 18 below) to electrically connect the metallization lines with the conductive lines 160 below.

Figure 16:
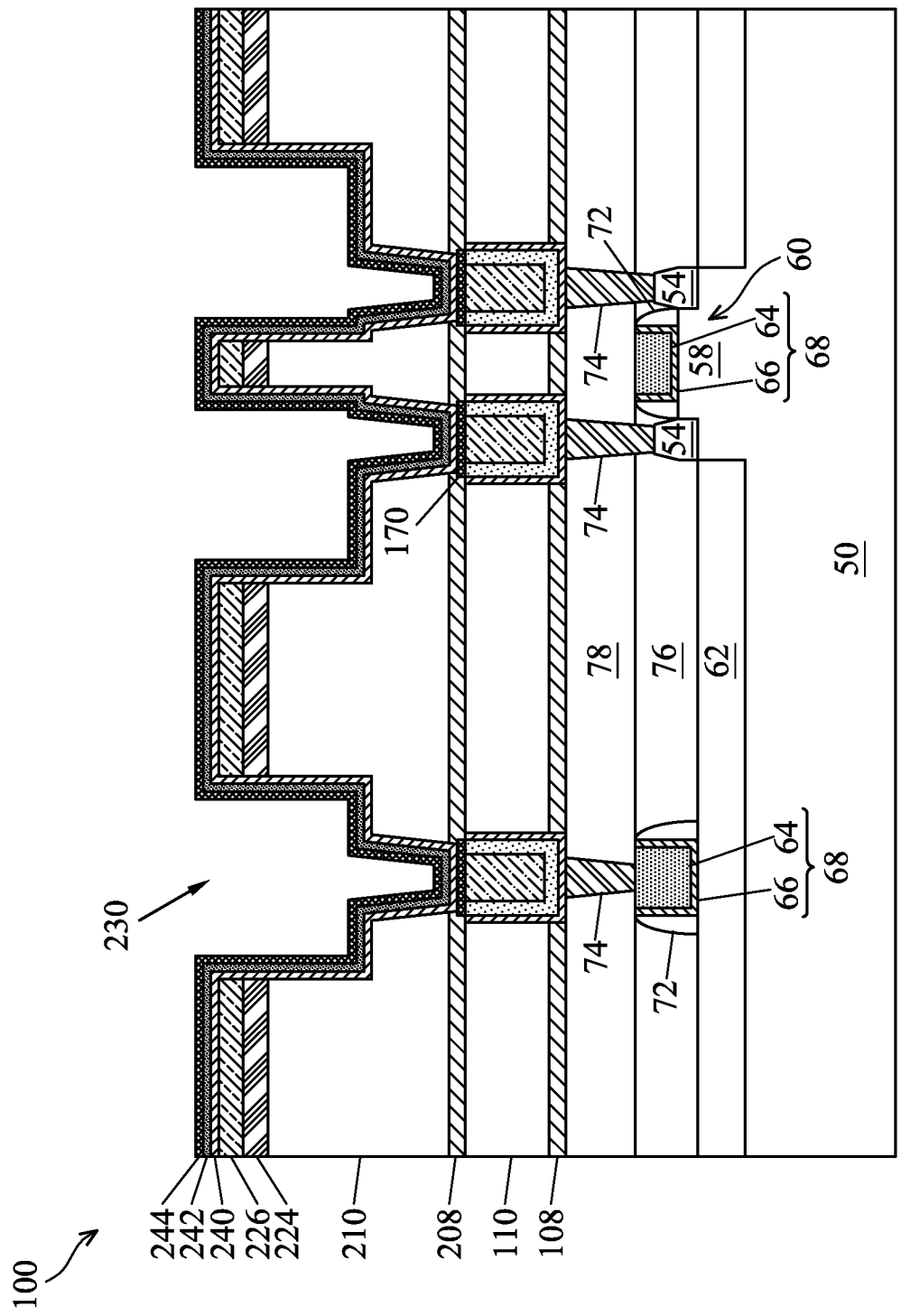

In FIG. 16, a barrier layer 240, a third liner layer 242, and a fourth liner layer 244 are formed in the openings 230. The barrier layer 240 may be formed of similar materials and by a similar process as described above in connection with the barrier layer 140. The third liner layer 242 may be formed of similar materials and by a similar process as described above in connection with the first liner layer 142. The fourth liner layer 244 may be formed of similar materials and by a similar process as described above in connection with the second liner layer 144.

Figure 17:
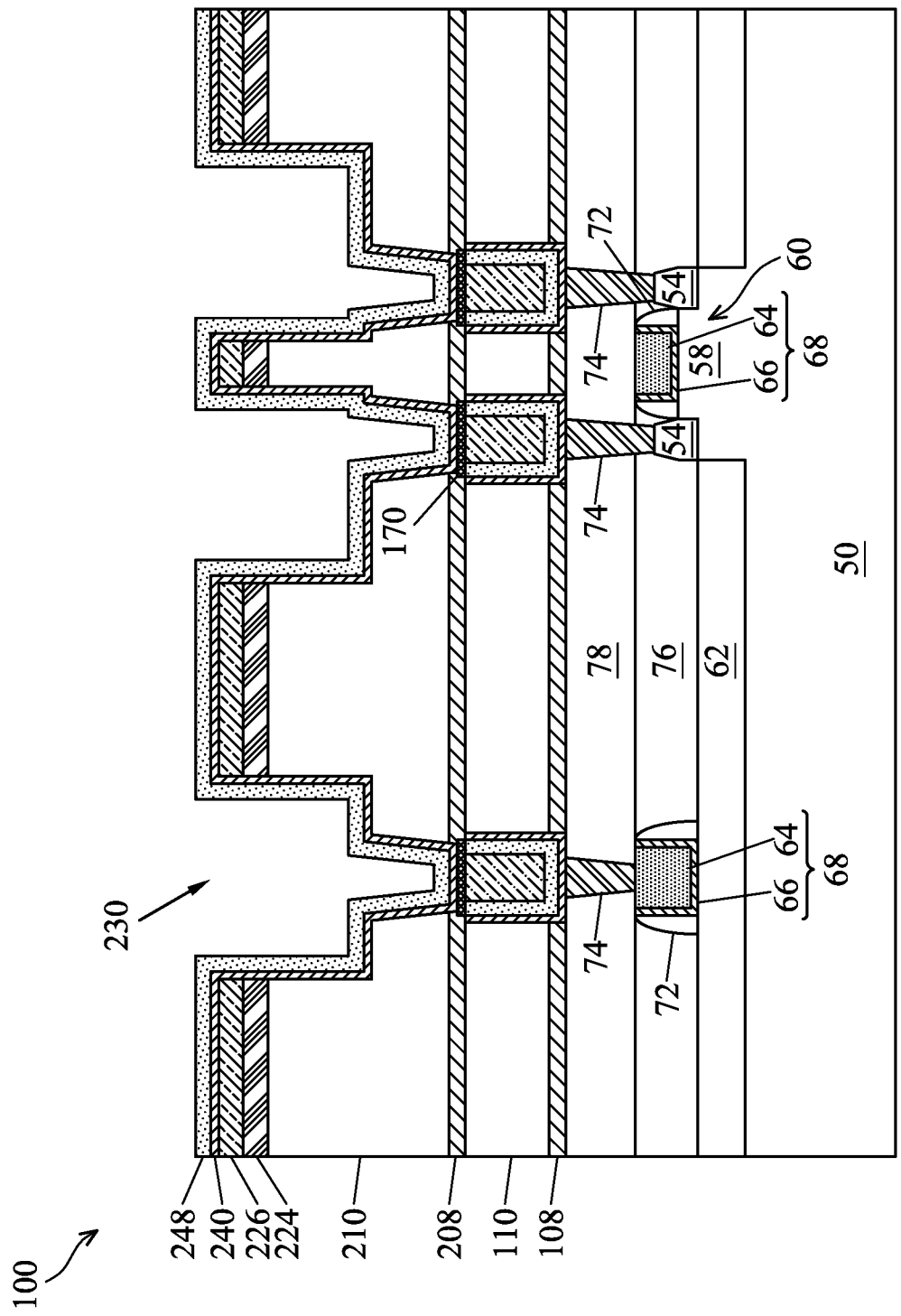

In FIG. 17, a combined liner layer 248 may be formed by performing a hydrogen plasma treatment on the wafer 100. The hydrogen plasma treatment may facilitate intermixing between the third liner layer 242 and the fourth liner layer 244. In accordance with some embodiments, the hydrogen plasma treatment includes bombarding the wafer 100 with hydrogen plasma for a period of about 10 seconds to about 60 seconds, or about 30 seconds. As a result of the hydrogen plasma treatment, the exposed surface of the combined liner layer 248 may comprise about 5% to about 20% ruthenium. The combined liner layer 248 may have a thickness of about 15 Å to about 50 Å, or about 20 Å to about 40 Å, such as about 30 Å.

Figure 18:
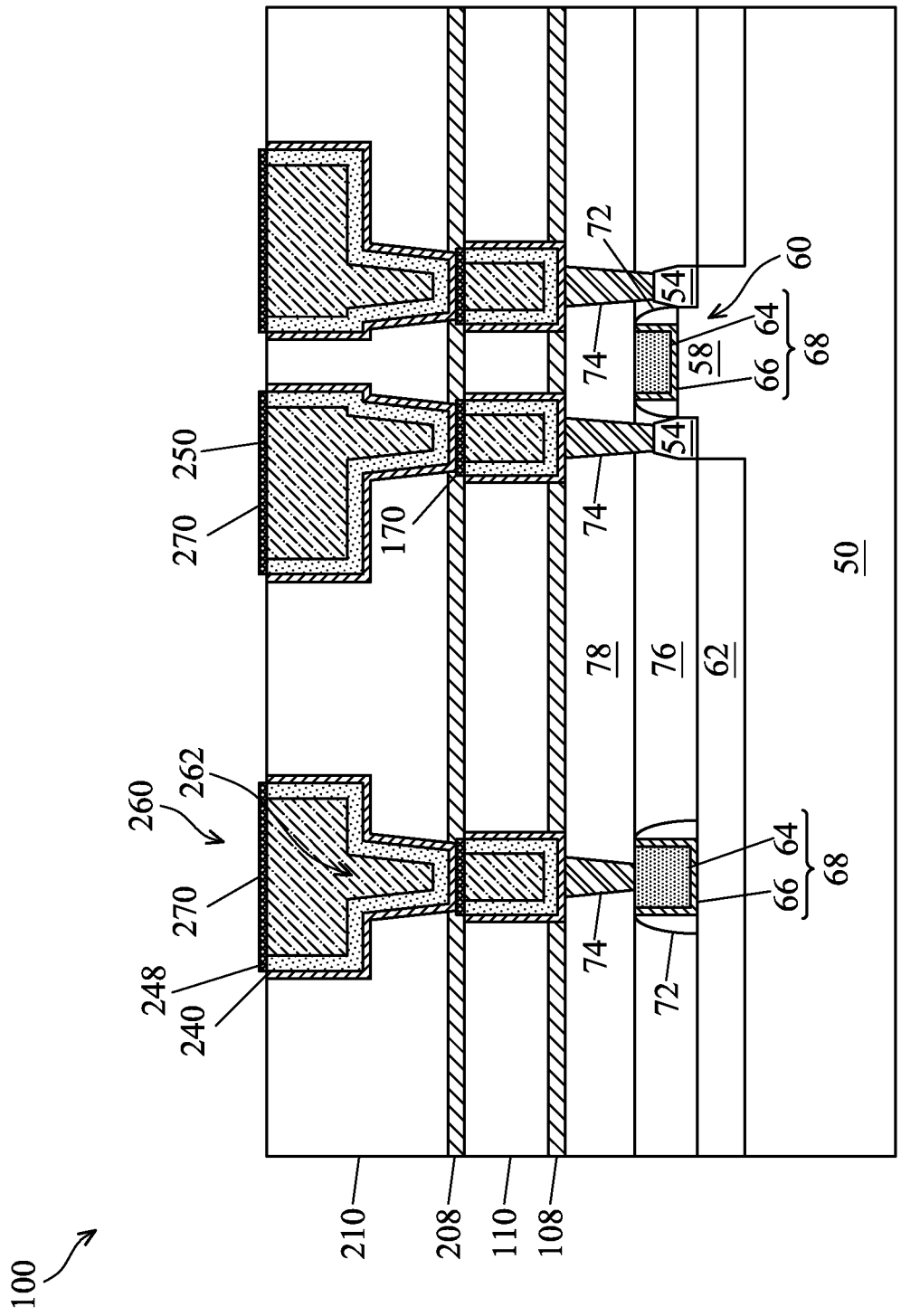

In FIG. 18, a conductive material 250 is filled into the openings 230 and along top surfaces of the combined liner layer 248, and a planarization process is performed to remove excess of the conductive material 250, the combined liner layer 248, and the barrier layer 240 to form metallization lines 260. The conductive material 250 may be formed of similar materials and by a similar process as described above in connection with the conductive material 150.

In accordance with some embodiments, a deposition method, such as PVD, may be used to form the conductive material 250 in the openings 230. For example, a first deposition of copper may be performed at room temperature, which may be followed by a reflow process at about 150° C. to about 300° C. for about 1 minute to about 10 minutes. One or more depositions of copper and reflow processes may follow the first cycle. In total, there may be one to five alternating cycles of depositions and reflow processes. As discussed above, a benefit of the hydrogen plasma treatment in the previous step is that the upper surface of the combined liner layer 248 having about 5% to about 20% ruthenium provides improved deposition and reflow of the conductive material 250 by having enhanced dewettability from the combined liner layer 248. As such, the conductive material 250 is less likely to accumulate at upper portions of the openings 230 or at upper portions of the conductive via portions of the openings 230, which may otherwise result in pinching across those upper portions. In addition, to the extent accumulation and/or pinching occur, those occurrences will be reduced or alleviated by the reflow process(es) due to the enhanced dewettability between the layers.

Still referring to FIG. 18, a planarization process may be performed to remove excess of the conductive material 250, the combined liner layer 248, and the barrier layer 240, thereby forming metallization lines 260 and conductive vias 262 in the openings 230. In addition, the planarization process may remove remaining portions of the mask layer 226 and the buffer layer 224, thereby exposing the IMD layer 210. The planarization process may be a grinding or a CMP, and may be performed such that the top surfaces of the conductive material 250, the combined liner layer 248, the barrier layer 240, and the IMD layer 210 are level or are substantially level. The metallization lines 260 and the conductive vias 262 include remaining portions of the conductive material 250 and the remaining portions of the combined liner layer 248 and the barrier layer 240 extending along the sidewalls and bottoms of the conductive material 250. The metallization lines 260 are electrically connected to the conductive lines 160 by the conductive vias 262.

Furthermore, a capping layer 270 may be formed over the conductive material 250 and the combined liner layer 248 of the metallization lines 260. The capping layer 270 may be formed of similar materials (e.g., cobalt) and by a similar process as described above in connection with the capping layer 170. The capping layer 270 may be considered part of the metallization lines 260. The capping layer 270 may have a thickness of between about 15 Å and about 50 Å. In addition, as part of the testing of the subset of the chips or wafers, as discussed above, electromigration testing may be included to show that the devices meet the electromigration specifications, such as sufficiently low electromigration of the material of the capping layer 270 into the combined liner layer 248.

Following completion of the metallization lines 260 and the conductive vias 262, additional metallization lines may be formed over the metallization lines 260 using similar materials and similar processes as described above with either the conductive lines 160 or the metallization lines 260.

In the above embodiments, the same or similar materials and processes were described for forming the conductive lines 160 (including the combined liner layer 148) and the metallization lines 260 with the conductive vias 262 (including the combined liner layer 248). In addition, one or more steps of forming the metallization lines 260 with the conductive vias 262 may be performed using different materials and/or processes as compared with the corresponding step of forming the conductive lines 160.

As discussed above, particular selection of liner layers and other related processing steps help to form conductive features at a higher yield and with greater performance reliability. The conductive features may include, in the order of formation, a barrier layer, a first liner layer, a second liner layer, a combined liner layer (replacing the first liner layer and the second liner layer), a conductive material, and a capping layer. A first benefit is that a first material in the first liner layer is selected to provide stronger adherence and more thorough coverage of the first liner layer to the underlying barrier layer. A second benefit is that the first material of the first liner layer and a second material of the overlying second liner layer are intermixed to allow a top surface of the resulting combined liner layer to exhibit certain beneficial properties from the first material of the first liner layer. For example, the first material along the surface of the combined liner layer allows the conductive material to fill lower portions of openings before filling upper portions of those same openings. As a result, pinching off of the conductive material in upper portions of the openings is reduced or prevented. Further, to the extent pinch-offs occur, the dewettability of the conductive material over the first material allows for those pinch-offs to be alleviated by reflowing the conductive material. A third benefit is that the second material of the second liner layer includes a third material of the capping layer in order to reduce electromigration of that third material from the capping layer into the combined liner layer during use of the completed semiconductor device. While the combination of ruthenium and cobalt liner layers has been discussed above, other combinations of materials, such as combinations of other materials discussed above with respect to the corresponding liner layers, may provide similar benefits and which are within the contemplated scope of this disclosure.

In an embodiment, a method of forming a semiconductor device includes forming an opening in a dielectric layer, and forming a barrier layer in the opening. A combined liner layer is formed over the barrier layer by first forming a first liner layer including ruthenium over the barrier layer, and next forming a second liner layer including cobalt over the first liner layer. A conductive material layer including copper is formed over the combined liner layer, and a thermal process is performed to reflow the conductive material layer.

In another embodiment, a method of forming a semiconductor device includes depositing a dielectric layer over a substrate, and patterning the dielectric layer to form an opening having sidewalls and a bottom surface. A barrier layer is deposited over the dielectric layer and in the opening. A ruthenium layer is deposited over the barrier layer, and a cobalt layer is deposited over the ruthenium layer. A hydrogen plasma treatment is then performed to form an intermixed binary layer comprising ruthenium and cobalt. A first copper layer is deposited over the intermixed binary layer.

In yet another embodiment, a structure includes a dielectric layer includes a trench; a barrier layer disposed in the trench and over a sidewall of the dielectric layer; a liner layer disposed in the trench, a sidewall of the liner layer disposed over a sidewall of the barrier layer, a bottom portion of the liner layer disposed over a bottom portion of the barrier layer, the liner layer includes a top surface and a bottom surface, a first composition of the liner layer at a first location on the top surface being different from a second composition of the liner layer at a second location on the bottom surface; and a conductive fill material disposed in the trench and over the sidewall and the bottom portion of the liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
 forming an opening in a dielectric layer;
 forming a barrier layer in the opening;
 forming a combined liner layer over the barrier layer, the forming the combined liner layer comprising:
  forming a first liner layer over the barrier layer, the first liner layer comprising ruthenium, the barrier layer being free of cobalt;

after forming the first liner layer, forming a second liner layer over the first liner layer, the second liner layer comprising cobalt; and after forming the second liner layer, performing a hydrogen treatment to intermix the first liner layer and the second liner layer to form the combined liner layer, wherein the hydrogen treatment results in an exposed surface of the combined liner layer comprising ruthenium;

forming a conductive material layer over the combined liner layer, the conductive material layer comprising copper; and performing a thermal process to reflow the conductive material layer.

2. The method of claim 1, wherein performing the hydrogen treatment to form the combined liner layer further comprises performing a hydrogen plasma treatment.

3. The method of claim 2, wherein during the hydrogen plasma treatment, ruthenium in the first liner layer intermixes with cobalt in the second liner layer resulting in the exposed surface of the combined liner layer comprising 5-20% ruthenium.

4. The method of claim 1 further comprising forming a capping layer over the conductive material layer, the capping layer comprising cobalt.

5. The method of claim 4, wherein the forming the capping layer comprises:

depositing cobalt over the conductive material layer, the combined liner layer, the barrier layer, and the dielectric layer; and etching the cobalt to expose a surface of the dielectric layer.

6. The method of claim 1, wherein the barrier layer is physically and electrically coupled to a contact plug.

7. The method of claim 6 further comprising forming a metallization feature over and electrically coupled to the conductive material layer.

8. The method of claim 7 further comprising after forming the conductive material layer, planarizing the conductive material layer, a top surface of the conductive material layer being level with a top surface of the combined liner layer and a top surface of the dielectric layer.

9. A method of forming a semiconductor device, comprising:

depositing a dielectric layer over a substrate;

patterning the dielectric layer to form an opening, the opening comprising sidewalls and a bottom surface;

depositing a barrier layer over the dielectric layer and in the opening;

depositing a ruthenium layer over an exposed surface of the barrier layer;

depositing a cobalt layer over an exposed surface of the ruthenium layer;

performing a hydrogen plasma treatment on an exposed surface of the cobalt layer to result in an intermixed binary layer comprising ruthenium and cobalt; and depositing a first copper layer over an exposed surface of the intermixed binary layer, the exposed surface of the intermixed binary layer comprising ruthenium.

10. The method of claim 9, wherein the ruthenium layer has a first thickness greater than or equal to about 5 Å.

11. The method of claim 10, wherein the cobalt layer has a second thickness greater than or equal to about 10 Å, a sum of the first thickness and the second thickness being between about 20 Å and about 40 Å.

12. The method of claim 9, wherein after the hydrogen plasma treatment a surface of the intermixed binary layer opposite of the substrate comprises between about 5% and about 20% ruthenium.

13. The method of claim 9 further comprising performing a first thermal process to reflow the first copper layer.

14. The method of claim 13 further comprising:

depositing a second copper layer over the first copper layer; and performing a second thermal process to reflow the first copper layer and the second copper layer.

15. The method of claim 9 further comprising forming a capping layer over the first copper layer, the capping layer comprising cobalt.

16. The method of claim 15 further comprising performing an electromigration test to measure electromigration of cobalt atoms from the capping layer to the intermixed binary layer.

17. A method of forming a semiconductor device, comprising:

forming a recess in a first dielectric layer;

depositing a first conductive layer in the recess;

depositing a second conductive layer over the first conductive layer;

depositing a third conductive layer over the second conductive layer;

performing a plasma treatment to form an alloy layer, the alloy layer comprising metals in the second conductive layer and the third conductive layer, wherein the plasma treatment is free of the metals in the second conductive layer and the third conductive layer;

depositing a fourth conductive layer over the alloy layer; and planarizing the first conductive layer, the alloy layer, and the fourth conductive layer.

18. The method of claim 17, wherein the depositing the fourth conductive layer comprises:

depositing a first copper layer;

performing a first thermal treatment;

depositing a second copper layer; and performing a second thermal treatment.

19. The method of claim 18, wherein the first thermal treatment reflows the first copper layer, and wherein the second thermal treatment reflows the second copper layer.

20. The method of claim 17, wherein the second conductive layer comprises ruthenium, and wherein the third conductive layer comprises cobalt.

* * * * *

UNITED STATES PATENT AND TRADEMARK OFFICE
CERTIFICATE OF CORRECTION

| | |
|---|---|
| PATENT NO. | : 11,854,878 B2 |
| APPLICATION NO. | : 17/066706 |
| DATED | : December 26, 2023 |
| INVENTOR(S) | : Hsieh et al. |

It is certified that error appears in the above-identified patent and that said Letters Patent is hereby corrected as shown below:

On the Title Page

Item (73), in Column 1, in "Assignee", Line 2, delete "LTD.," and insert -- CO., LTD., --.

Signed and Sealed this
Twenty-sixth Day of March, 2024

Katherine Kelly Vidal
*Director of the United States Patent and Trademark Office*